United States Patent
Kim et al.

(10) Patent No.: US 12,550,330 B2
(45) Date of Patent: Feb. 10, 2026

(54) METHOD OF MANUFACTURING SEMICONDUCTOR

(71) Applicant: Samsung Electronics Co., Ltd., Suwon-si (KR)

(72) Inventors: Dongyoung Kim, Suwon-si (KR); Soojung Park, Suwon-si (KR); Hyesong Jeon, Suwon-si (KR); Hyungon Pyo, Suwon-si (KR); Iksoo Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 304 days.

(21) Appl. No.: 18/347,906

(22) Filed: Jul. 6, 2023

(65) Prior Publication Data
US 2024/0188301 A1    Jun. 6, 2024

(30) Foreign Application Priority Data
Dec. 5, 2022    (KR) .................. 10-2022-0168129

(51) Int. Cl.
*H10B 43/35*    (2023.01)
*H10B 41/10*    (2023.01)
*H10B 41/27*    (2023.01)
*H10B 41/35*    (2023.01)
*H10B 43/10*    (2023.01)
*H10B 43/27*    (2023.01)

(52) U.S. Cl.
CPC ............. *H10B 43/35* (2023.02); *H10B 41/10* (2023.02); *H10B 41/27* (2023.02); *H10B 41/35* (2023.02); *H10B 43/10* (2023.02); *H10B 43/27* (2023.02)

(58) Field of Classification Search
CPC ........ H10B 43/35; H10B 41/10; H10B 41/27; H10B 41/35; H10B 43/10; H10B 43/27
See application file for complete search history.

(56) References Cited

U.S. PATENT DOCUMENTS

| | | | |
|---|---|---|---|
| 8,309,405 | B2 | 11/2012 | Yang et al. |
| 9,281,414 | B2 | 3/2016 | Won et al. |
| 10,411,034 | B2 | 9/2019 | Jang et al. |
| 10,714,493 | B2 | 7/2020 | Yang et al. |
| 11,049,875 | B2 | 6/2021 | Hazue |
| 2021/0104538 | A1 | 4/2021 | Lee et al. |
| 2021/0358943 | A1 | 11/2021 | Lee |

*Primary Examiner* — Samuel A Gebremariam
(74) *Attorney, Agent, or Firm* — HARNESS, DICKEY & PIERCE, P.L.C.

(57) ABSTRACT

A method of manufacturing a semiconductor device may include selectively depositing a carbon layer on sidewalls of a substrate mold before depositing a sacrificial metal layer in a semiconductor device structure having a vertical stacked structure.

20 Claims, 39 Drawing Sheets

METHOD OF MANUFACTURING SEMICONDUCTOR

CROSS-REFERENCE TO RELATED APPLICATION

This application is based on and claims priority under 35 U.S.C. § 119 to Korean Patent Application No. 10-2022-0168129, filed on Dec. 5, 2022 in the Korean Intellectual Property Office, the disclosure of which is incorporated by reference herein in its entirety.

BACKGROUND

Inventive concepts relate to a method of manufacturing a semiconductor device. More particularly, inventive concepts relate to a method of manufacturing a semiconductor device, in which a substrate crimping phenomenon of the semiconductor device may be limited and/or prevented.

A semiconductor device capable of storing data of high capacity may be required in an electronic system in need of data storage, and accordingly, a method to increase the data storage capacity of the semiconductor device is being studied. For example, as one of the methods to increase the data storage capacity of the semiconductor device, the semiconductor device including a vertical memory device that includes three-dimensionally arranged memory cells instead of two-dimensionally arranged memory cells has been proposed.

SUMMARY

Inventive concepts provide a method of manufacturing a semiconductor device in which the occurrence of a substrate crimping phenomenon due to a chemical reaction of a sacrificial layer and a substrate may be limited and/or prevented, when an etching process is performed and a process of filling the sacrificial layer is performed to manufacture a multi-stack structure.

In addition, the issues to be solved by technical ideas of inventive concepts are not limited to those mentioned above, and other issues may be clearly understood by those of ordinary skill in the art from the following descriptions.

Provided below is a method of manufacturing a semiconductor device.

According to an embodiment of inventive concepts, a method of manufacturing a semiconductor device may include forming a first stack by alternately stacking a plurality of first layers and a plurality of second layers one layer at a time on a substrate; forming a first vertical hole penetrating the first stack in a vertical direction; depositing a first carbon layer on internal sidewalls of the first vertical hole, the first carbon layer being in contact with portions exposed via the first vertical hole among the plurality of first layers and the plurality of second layers; forming a first sacrificial metal layer filling the first vertical hole on the first carbon layer; forming a second stack on the first stack, the second stack including a plural amount of first layers and a plural amount of second layers alternately stacked one layer at a time therein; forming a second vertical hole penetrating the second stack in the vertical direction, the second vertical hole in fluid communication with the first vertical hole; depositing a second carbon layer on internal sidewalls of the second vertical hole, the second carbon layer being in contact with portions exposed via the second vertical hole among the plural amount of first layers and the plural amount of second layers; forming a second sacrificial metal layer filling the second vertical hole on the second carbon layer; forming a third stack on the second stack; forming a third vertical hole penetrating the third stack in the vertical direction, the third vertical hole in fluid communication with the second vertical hole; and removing the first sacrificial metal layer, the second sacrificial metal layer, the first carbon layer, and the second carbon layer.

According to an embodiment of inventive concepts, a method of manufacturing a semiconductor device may include forming a first stack by alternately stacking a plurality of first layers and a plurality of second layers one layer at a time on a substrate; forming a first vertical hole penetrating the first stack in a vertical direction; depositing a first carbon layer on internal sidewalls of the first vertical hole, the first carbon layer being in contact with portions exposed via the first vertical hole among the plurality of first layers and the plurality of second layers; forming a first sacrificial metal layer filling the first vertical hole on the first carbon layer; forming a second stack on the first stack, the second stack including a plural amount of first layers and a plural amount of second layers alternately stacked one layer at a time therein; forming a second vertical hole penetrating the second stack in the vertical direction, the second vertical hole in fluid communication with the first vertical hole; depositing a second carbon layer on internal sidewalls of the second vertical hole, the second carbon layer being in contact with portions exposed via the second vertical hole among the plural amount of first layers and the plural amount of second layers; forming a second sacrificial metal layer filling the second vertical hole on the second carbon layer; forming a third stack on the second stack, the third stack including a plural number of first layers and a plural number of second layers alternately stacked on the second stack; forming a third vertical hole penetrating the third stack in the vertical direction, the third vertical hole in fluid communication with the second vertical hole; and removing the first sacrificial metal layer, the second sacrificial metal layer, the first carbon layer, and the second carbon layer.

According to an embodiment of inventive concepts, a method of manufacturing a semiconductor device may include performing a process cycle on a substrate, preparing a plurality of features, forming a first feature, forming a second feature, and performing a strip process. The process cycle may include forming a layer stack on a substrate, forming a plurality of openings extending a depth from an uppermost surface of the layer stack to a lowermost surface of the layer stack, depositing a carbon layer on internal sidewalls of the layer stack in the plurality of openings, and filling the plurality of openings with a sacrificial metal layer. The layer stack may include a plurality of silicon oxide layers and a plurality of silicon nitride layers alternately stacked on each other. The carbon layer may have a thickness in a range of about 5 nm to about 15 nm. The depositing the carbon layer may include selectively depositing the carbon layer on exposed sidewalls of the plurality of silicon nitride layers of the layer stack and not depositing the carbon layer on exposed sidewalls of the plurality of silicon oxide layers of the layer stack. The preparing the plurality of features may include preparing the plurality of features on the sacrificial metal layer by completing the process cycle one time. The forming the first feature may be performed by forming a silicon dioxide stack on some features among the plurality of features and by forming a first opening with a depth extending from an uppermost surface of the silicon dioxide stack to a lowermost surface of the silicon dioxide stack. The first opening may be in fluid communication with a corresponding one of the plurality of openings of the layer stack. The forming the first feature may include forming a first carbon film in the first opening and forming a first sacrificial metal film in the first opening. The forming a second feature may include forming a new layer stack on other features among the plurality of features. The second feature may include a plural amount of silicon oxide layers and a plural amount of silicon nitride layers alternately stacked on each other on the other features among the plurality of features. The forming the second feature may include forming a second opening with a depth extending from an uppermost surface of the new layer stack to a lowermost surface of the new layer stack. The second opening may be in fluid communication with an underlying one of the plurality of openings. The forming the second feature may include forming a second carbon film in the second opening and forming a second sacrificial metal film in the second opening. The strip process may include simultaneously removing the sacrificial metal layer, the carbon layer, the first carbon film, the second carbon film, the first sacrificial metal film, and the second sacrificial metal film.

BRIEF DESCRIPTION OF THE DRAWINGS

Embodiments will be more clearly understood from the following detailed description taken in conjunction with the accompanying drawings in which:

FIG. 4 is a schematic plan view of some components of a memory cell block of the chip region, FIG. 5A is a cross-sectional view taken along line Y1-Y1' in FIG. 4, FIG. 5B is a cross-sectional view taken along line X1-X1' in FIG. 4, FIG. 5C is an enlarged cross-sectional view taken along line X2-X2' in FIG. 4, and FIG. 5D is an enlarged cross-sectional view of some components included in a region indicated as "EX1" in FIG. 5A;

FIGS. 8A through 15C are cross-sectional views for describing a method of manufacturing a semiconductor device, according to embodiments; in detail, FIGS. 8A, 11A, 12A, 13A, 14A, and 15A are cross-sectional views of some components in a portion corresponding to a cross-section along line Y1-Y1' in FIG. 4 according to a process sequence, FIGS. 8C, 9B, 10B, 11C, 12C, 13C, 14C, and 15C are cross-sectional views of some components in a portion corresponding to a cross-section along line X2-X2' in FIG. 4 according to a process sequence.

DETAILED DESCRIPTION

Figure 1:
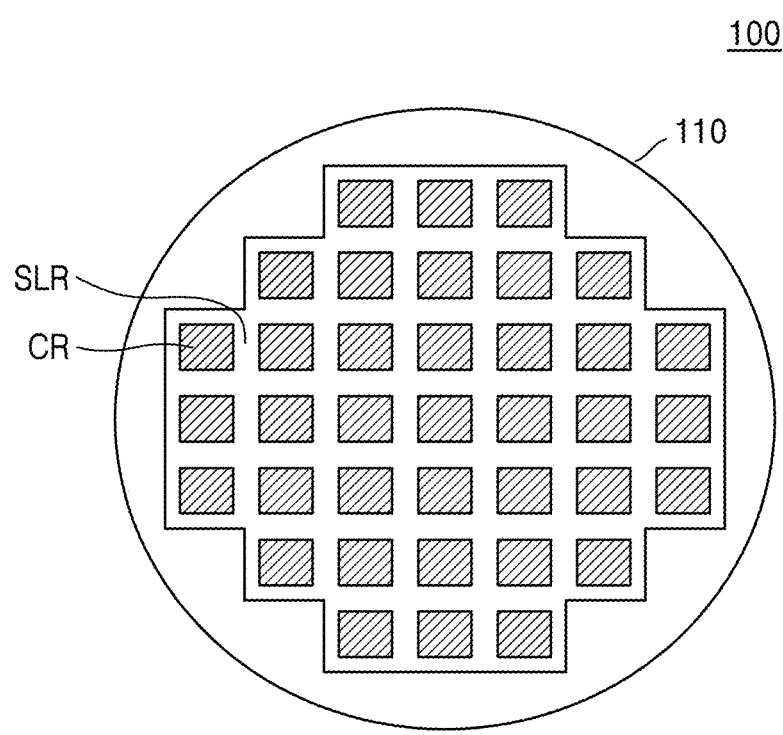
FIG. 1 is a schematic plan view of a semiconductor device obtained according to a method of manufacturing a semiconductor device, according to an embodiment.

When the terms "about" or "substantially" are used in this specification in connection with a numerical value, it is intended that the associated numerical value includes a manufacturing or operational tolerance (E.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially." it will be understood that these values and shapes should be construed as including a manufacturing or operational tolerance (E.g., ±10%) around the stated numerical values or shapes. When ranges are specified, the range includes all values therebetween such as increments of 0.1%.

Hereinafter, embodiments of inventive concepts are described in detail with reference to accompanying diagrams. Identical reference numerals are used for the same constituent devices in the drawings, and duplicate descriptions thereof are omitted.

Because various changes can be applied to the embodiments and inventive concepts may have various embodiments, particular embodiments are illustrated in the diagrams and described in detail. However, this is not intended to limit inventive concepts to particular modes of practice, and it is to be appreciated that all changes, equivalents, and substitutes, which do not depart from the spirit and technical scope of inventive concepts, are encompassed in inventive concepts. In the description of the embodiments, certain detailed explanations of the related art are omitted when it is deemed that they may unnecessarily obscure the essence of the embodiments.

FIG. 1 is a schematic plan view of a semiconductor device 100 obtained according to a method of manufacturing a semiconductor device, according to an embodiment.

Referring to FIG. 1, the semiconductor device 100 includes a substrate 110 having a plurality of chip regions CR and a scribe lane region SLR surrounding each of the plurality of chip regions CR. The plurality of chip regions CR may be arranged in a matrix form on the substrate 110. The scribe lane region SLR may include a cutting region for individualizing the plurality of chip regions CR.

Each of the plurality of chip regions CR may be a high density region having a relatively high pattern density, and the scribe lane region SLR may be a low density region having a relatively low pattern density. The plurality of chip regions CR may include a memory cell array region of a semiconductor memory device, a periphery circuit region including circuits configured to be electrically connected to memory cells included in the memory cell array region, and a core region. In embodiments, a non-volatile memory cell array such as a vertical NAND flash memory may be formed in the memory cell array region. In the memory cell array region, a plurality of patterns having relatively small widths may be apart from each other in a regular array, and may be repeatedly formed at a relatively small pitch.

Figure 2:
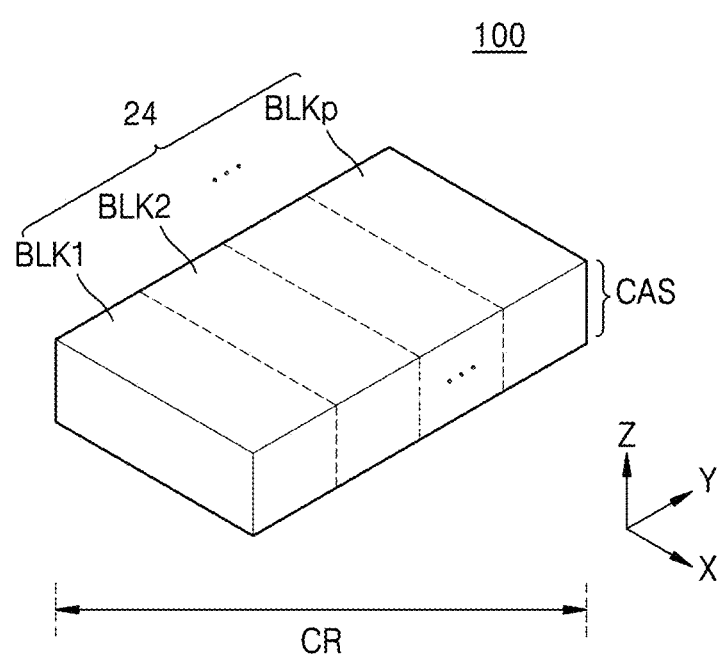
FIG. 2 is a schematic perspective view of some components of a memory cell array region included in a chip region of a semiconductor device, according to an embodiment.

FIG. 2 is a schematic perspective view of some components of the memory cell array region included in each of the plurality of chip regions CR illustrated in FIG. 1.

Referring to FIG. 2, the chip region CR of the semiconductor device 100 may include a cell array structure CAS. The cell array structure CAS may include a plurality of tiles 24. The plurality of tiles 24 may each include a plurality of memory cell blocks BLK1, BLK2, . . . . BLKp. Each of the plurality of memory cell blocks BLK1, BLK2, . . . . BLKp-1, and BLKp may include three-dimensionally arranged memory cells.

Figure 3:
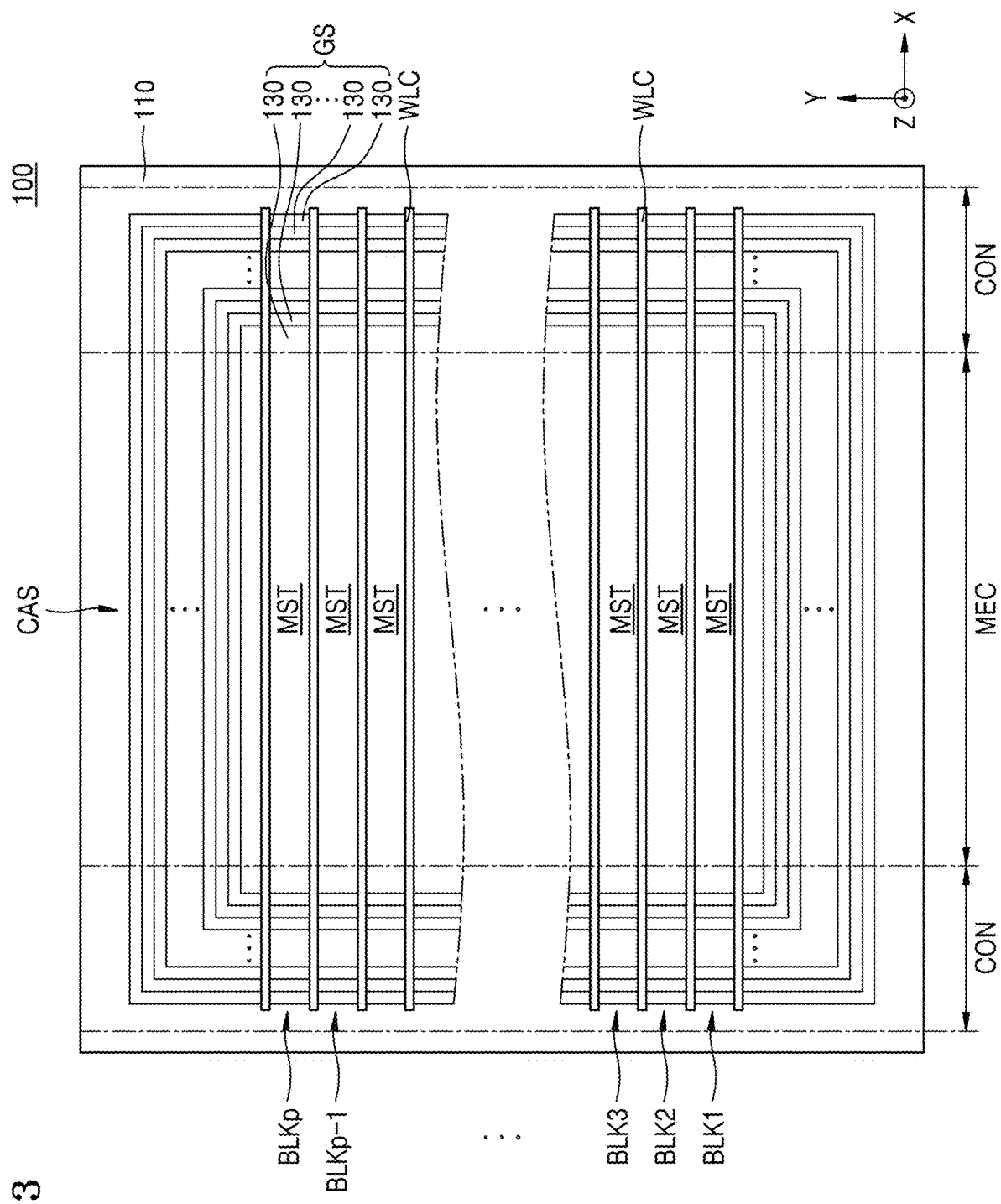
FIG. 3 is a schematic plan view of some regions of a chip region included in a semiconductor device, according to an embodiment.

FIG. 3 is a schematic plan view of some regions of the chip region CR included in the semiconductor device 100, according to an embodiment.

Referring to FIG. 3, in the chip region CR, the cell array structure CAS may include the substrate 110 and the plurality of memory cell blocks BLK1, BLK2, . . . . BLKp-1, and BLKp arranged on the substrate 110.

The cell array structure CAS may include a memory cell region MEC, and a connection region CON arranged on both sides of a first horizontal direction (X direction) of the memory cell region MEC. Each of the plurality of memory cell blocks BLK1, BLK2, . . . . BLKp-1, and BLKp may include a memory stack structure MST extending in the first horizontal direction (X direction) across the memory cell region MEC and the connection region CON. The memory stack structure MST may include a plurality of gate lines 130 stacked to overlap each other in a vertical direction (Z direction) in the memory cell region MEC and the connection region CON on the substrate 110. In each of a plurality of memory stack structures MST, a plurality of gate lines 130 may constitute a gate stack GS. Each of the plurality of memory stack structures MST may include a plurality of memory stacks arranged at different vertical levels in the vertical direction (Z direction) and overlapping each other in the vertical direction (Z direction). The plurality of memory stacks may respectively include a plurality of gate lines 130 overlapping each other in the vertical direction (Z direction). In embodiments, each of the plurality of memory stacks may include 48, 64, or 96 gate lines 130 stacked to overlap Each other in the vertical direction (Z direction), but is not limited thereto.

In embodiments, the area of the plurality of gate lines 130 included in the plurality of memory stack structures MST may gradually decrease on an X-Y plane away from the substrate 110. A central portion of each of the plurality of gate lines 130 overlapping each other in the vertical direction (Z direction) may form the memory cell region MEC, and an edge portion of Each of the plurality of gate lines 130 may form a connection region CON.

On the substrate 110, a plurality of word line cut structures WLC extending long in the first horizontal direction (X direction) in the memory cell region MEC and the connection region CON may be arranged. The plurality of word line cut structures WLC may be arranged apart from each other in a second horizontal direction (Y direction). The plurality of memory cell blocks BLK1, BLK2, . . . . BLKp-1, and BLKp may be arranged one by one between Each of the plurality of word line cut structures WLC.

Figure 4:
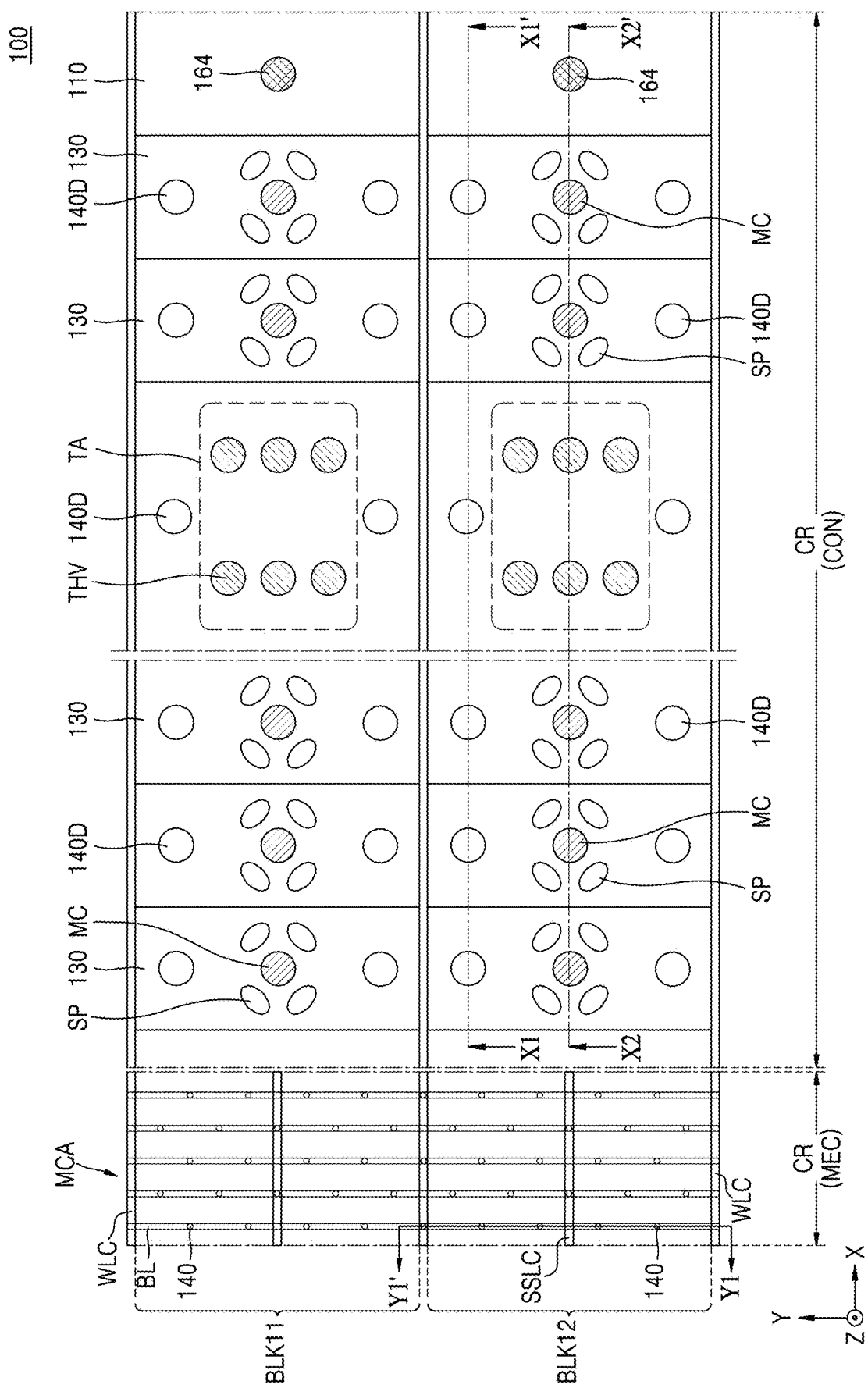
FIGS. 4 and 5A through 5D are diagrams for explaining in more detail components of a chip region of a semiconductor device, according to embodiments; in detail.
Figure 5A:
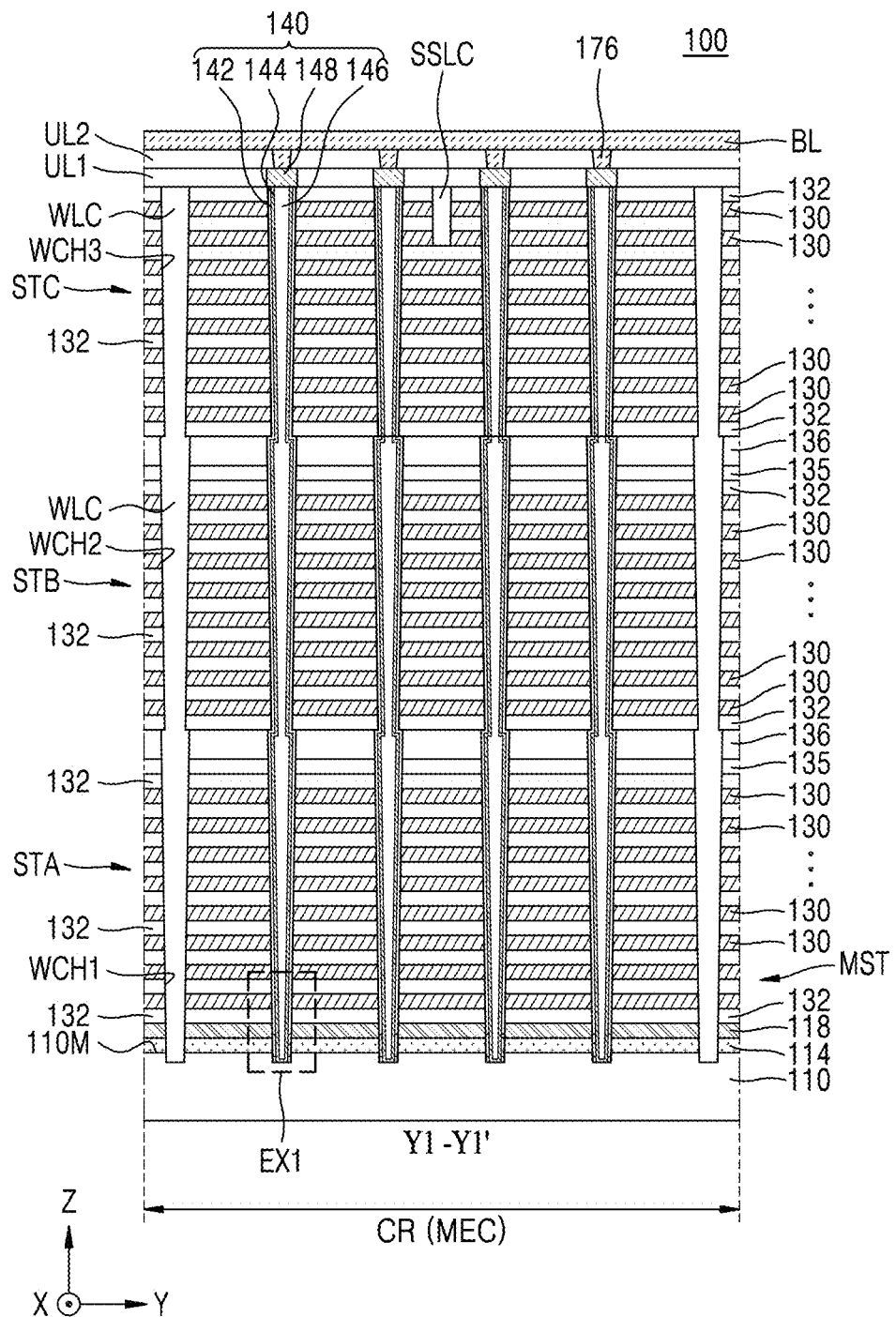
Figure 5B:
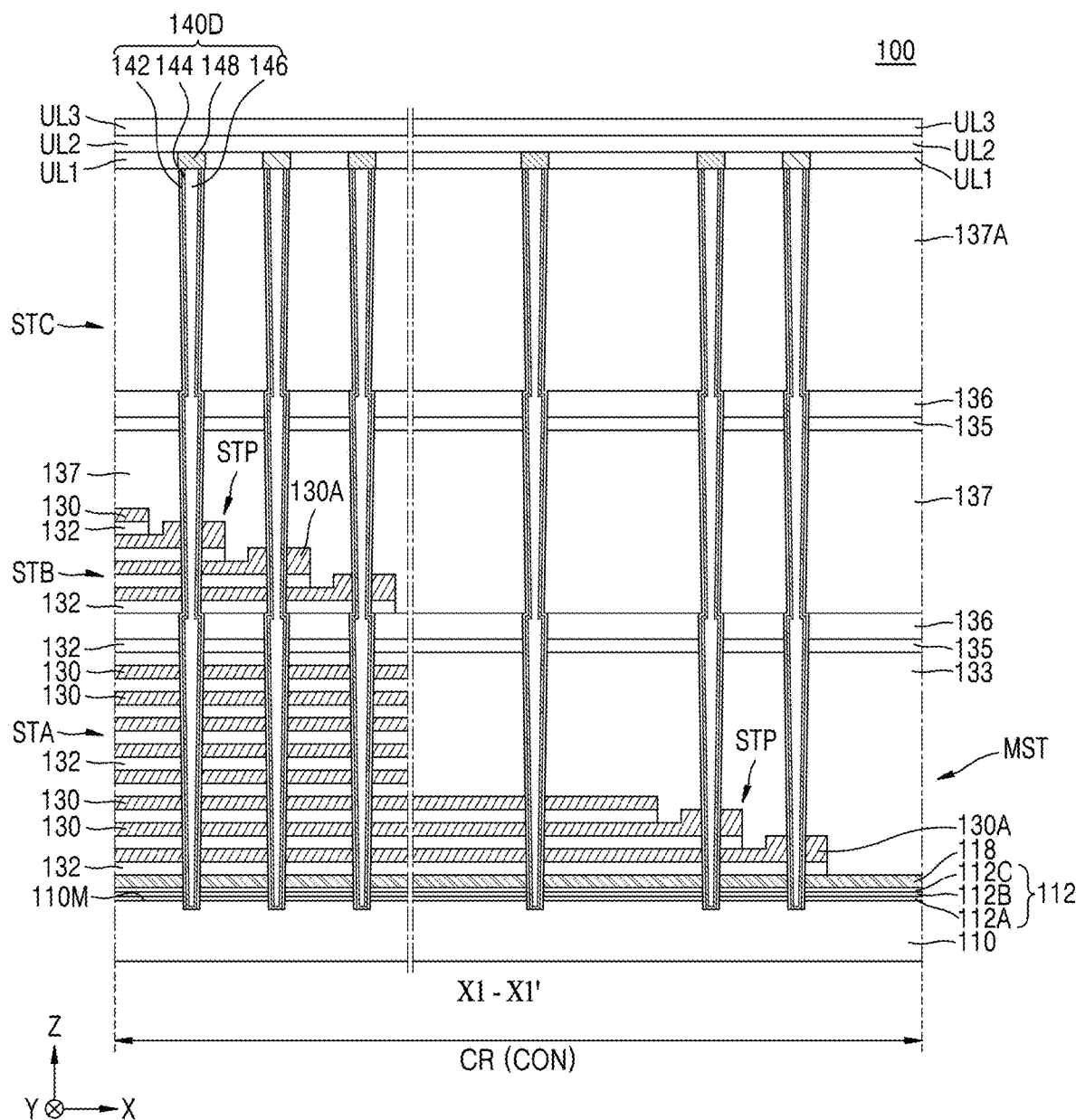
Figure 5C:
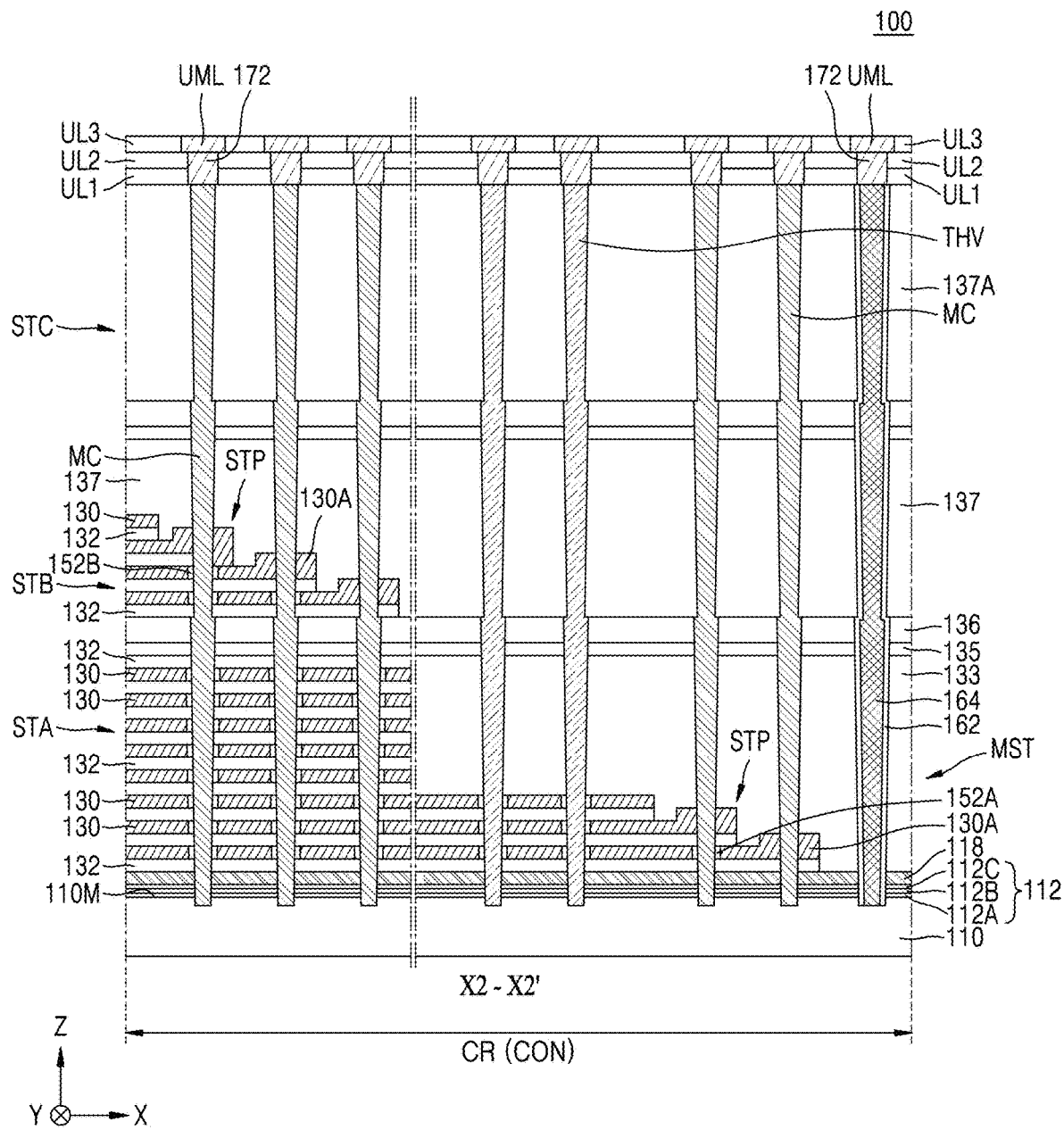
Figure 5D:
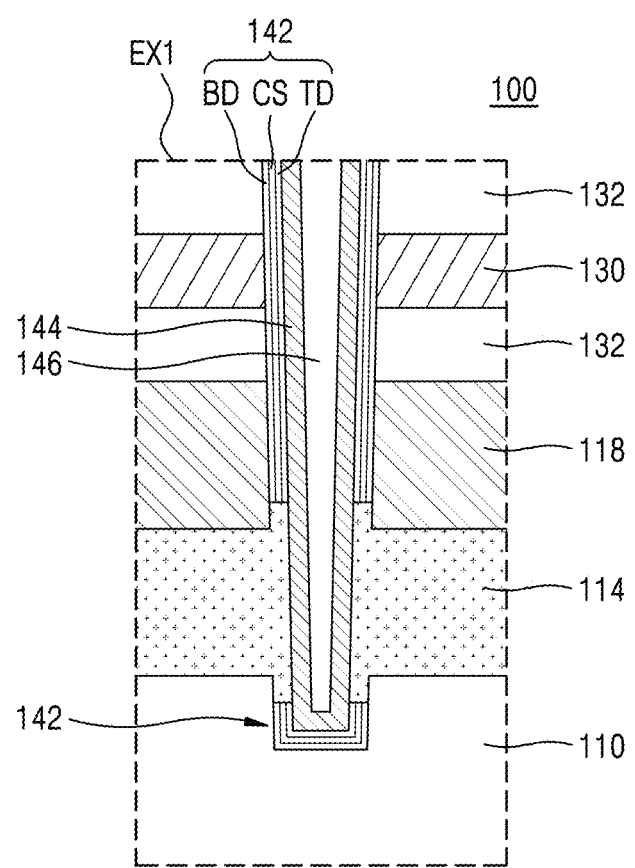

FIGS. 4 and 5A through 5D are diagrams for describing in detail components of the chip region CR of the semiconductor device 100. FIG. 4 is a schematic plan view of some components of the memory cell blocks BLK11 and BLK12 of the chip region CR. FIG. 5A is a cross-sectional view taken along line Y1-Y1' in FIG. 4. FIG. 5B is a cross-sectional view taken along line X1-X1' in FIG. 4. FIG. 5C is an enlarged cross-sectional view taken along line X2-X2' in FIG. 4. FIG. 5D is an enlarged cross-sectional view of some components included in a region indicated as "EX1" in FIG. 5A. Each of the memory cell blocks BLK11 and BLK12 illustrated in FIG. 4 may constitute any one among the plurality of memory cell blocks BLK1, BLK2, . . . , BLKp-1, and BLKp illustrated in FIG. 3.

Referring to FIGS. 4 and 5A through 5D, the chip region CR of the semiconductor device 100 may include the memory cell region MEC and the connection region CON on the substrate 110. In the memory cell region MEC and the connection region CON, a first stack STA arranged at a first vertical level on the substrate 110, a second stack STB arranged at a second vertical level higher than the first vertical level on the substrate 110, and a third stack STC arranged at a third vertical level higher than the second vertical level on the substrate 110. The term of "vertical level," as used herein, may indicate a distance in the vertical direction (Z direction or –Z direction) from an upper surface of the substrate 110.

Each of the first stack STA, the second stack STB, and the third stack STC may include the plurality of gate lines 130 overlapping each other in the vertical direction (Z direction) in the memory cell region MEC, and a step-type connection unit STP arranged in the connection region CON and including a plurality of conductive pad unit 130A integrally connected to the plurality of gate lines 130. The first stack STA, the second stack STB, and the third stack STC may constitute the cell array structure CAS illustrated in FIG. 3.

As illustrated in FIG. 5A, a first conductive plate 114 and a second conductive plate 118 may be arranged on the substrate 110 in the memory cell region MEC, and as illustrated in FIGS. 5B and 5C, an insulating plate 112 and the second conductive plate 118 may be arranged on the substrate 110 in the connection region CON. The memory stack structure MST including the first stack STA, the second stack STB, and the third stack STC may be arranged on the second conductive plate 118 in the memory cell region MEC and the connection region CON. In embodiments, in the memory cell region MEC, the first conductive plate 114 and the second conductive plate 118 may function as a source region for supplying current to vertical memory cells included in the cell array structure CAS.

In embodiments, the substrate 110 may include a semiconductor material such as polysilicon. The first conductive plate 114 and the second conductive plate 118 may Each include a doped polysilicon layer, a metal layer, or a combination thereof. The metal layer may include tungsten (W), but is not limited thereto. In the memory stack structure MST, the plurality of gate lines 130 may extend in parallel with each other in a horizontal direction (X direction and/or Y direction) and overlap each other in the vertical direction (Z direction). Each of the plurality of gate lines 130 may include a metal, metal silicide, a semiconductor doped with impurities, or a combination thereof. For example, Each of the plurality of gate lines 130 may include a metal, such as W, nickel, cobalt, and tantalum, metal silicide, such as tungsten silicide, nickel silicide, cobalt silicide, and tantalum silicide, and doped polysilicon, or a combination thereof.

An insulating layer 132 may be arranged between the second conductive plate 118 and the plurality of gate lines 130, and between each of the plurality of gate lines 130. In each of the first stack STA, the second stack STB, and the third stack STC, the gate line 130 at the uppermost layer among the plurality of gate lines 130 may be covered with the insulating layer 132. The insulating layer 132 may include silicon oxide.

As illustrated in FIGS. 5B and 5C, in the connection region CON, the edge portions of Each of the plurality of gate lines 130, a plurality of conductive pad units 130A, and a plurality of insulating layers 132 included in the first stack STA may be covered with a lower insulating block 133. In the connection region CON, edge portions of each of the plurality of gate lines 130, the plurality of conductive pad units 130A, and the plurality of insulating layers 132 included in the second stack STB may be covered with an intermediate insulating block 137. In the connection region CON, the third stack STC may be covered with an upper insulating block 137A. Although not illustrated in the drawings, the plurality of gate lines 130 and a conductive pad unit 130A at one end of each of the plurality of gate lines 130 may be formed in the third stack STC. Each of the lower insulating block 133, the intermediate insulating block 137, and the upper insulating block 137A may include a silicon oxide layer.

A first intermediate insulating layer 135 and a second intermediate insulating layer 136 may be sequentially stacked above the first stack STA between the first stack STA and the second stack STB. Each of the first intermediate insulating layer 135 and the second intermediate insulating layer 136 may include a silicon oxide layer. The first intermediate insulating layer 135 and the second intermediate insulating layer 136 may be sequentially stacked in the second stack STB between the second stack STB and the third stack STC.

As illustrated in FIGS. 4 and 5A, the plurality of word line cut structures WLC may extend long in the first horizontal direction (X direction) on the substrate 110 in the memory cell region MEC and the connection region CON. The width in the second horizontal direction (Y direction) of each of the plurality of gate lines 130 included in the memory cell blocks BLK1 and BLK12 may be limited by the plurality of word line cut structures WLC.

Each of the plurality of word line cut structures WLC may have an insulating structure. In some embodiments, the insulating structure may include silicon oxide, silicon nitride, silicon oxynitride, or a low-k material. For example, the insulating structure may include a silicon oxide layer, a silicon nitride layer, a silicon oxynitride (SiON) layer, a silicon oxycarbide nitride (SiOCN) layer, a silicon carbide nitride (SiCN) layer, or a combination thereof. In other embodiments, at least a portion of the insulating structure may also include an air gap. The term "air" may refer to the atmosphere or other gases that may be present during a manufacturing process.

The plurality of gate lines 130 may be stacked on the second conductive plate 118 between two adjacent word line cut structures WLC to overlap each other in the vertical direction (Z direction). The plurality of gate lines 130 may include a ground selection line, a plurality of word lines, and a string selection line.

In the plurality of gate lines 130, two gate lines 130 on an upper side may be separated from each other with the string selection line cut structure SSLC therebetween in the second horizontal direction (Y direction). Each of the two gate lines 130 separated from each other with the string selection line cut structure SSLC arranged therebetween may constitute the string selection line. FIG. 5A illustrates a case, in which one string selection line cut structure SSLC is formed in one gate stack GS (refer to FIG. 3) defined by two adjacent string selection line cut structures SSLC, but the embodiment is not limited thereto. For example, at least two string selection line cut structures SSLC may also be formed in one gate stack GS. The string selection line cut structure SSLC may be filled with an insulating layer. In embodiments, the string selection line cut structure SSLC may include an oxide layer, a nitride layer, or an insulating layer including a combination thereof. In embodiments, at least a portion of the string selection line cut structure SSLC may also include an air gap.

As illustrated in FIG. 5A, the plurality of channel structures 140 may penetrate the plurality of gate lines 130, the plurality of insulating layers 132, the first intermediate insulating layer 135, the second conductive plate 118, and the first conductive plate 114 and extend in the vertical direction (Z direction) on the substrate 110 in the memory cell region MEC. The plurality of channel structures 140 may be apart from each other at a certain interval in the first horizontal direction (X direction) and the second horizontal direction (Y direction). Each of the plurality of channel structures 140 may include a gate dielectric layer 142, a channel region 144, a buried insulating layer 146, and a drain region 148. Each of the plurality of channel structures 140 may be referred to as a plug structure.

As illustrated in FIG. 5D, the gate dielectric layer 142 may include a tunneling dielectric layer TD, a charge storage layer CS, and a blocking dielectric layer BD, which are sequentially formed from the channel region 144 toward the gate line 130. Relative thicknesses of the tunneling dielectric layer TD, the charge storage layer CS, and the blocking dielectric layer BD may not be limited to those illustrated in FIG. 5D, and may be variously modified.

The tunneling dielectric layer TD may include silicon oxide, hafnium oxide, aluminum oxide, zirconium oxide, tantalum oxide, etc. The charge storage layer CS may be an area in which electrons having passed through the tunneling dielectric layer TD from the channel region 144 are stored, and may include silicon nitride, boron nitride, silicon boron nitride, or impurities-doped polysilicon. The blocking dielectric layer BD may include silicon oxide, silicon nitride, or a metal oxide having a higher dielectric constant than silicon oxide. The metal oxide may include hafnium oxide, aluminum oxide, zirconium oxide, Ta oxide, or a combination thereof.

As illustrated in FIGS. 5A and 5D, the first conductive plate 114 may penetrate some region of the gate dielectric layer 142 in the horizontal direction (X direction and/or Y direction), and contact the channel region 144. The thickness (size in the Z direction) of a portion of the first conductive plate 114 vertically overlapping the gate dielectric layer 142 may be greater than the thickness (size in the Z direction) of a portion of the first conductive plate 114 vertically overlapping the second conductive plate 118. The gate dielectric layer 142 may include a portion covering the sidewalls of the channel region 144 at a higher level than the first conductive plate 114, and a portion covering a bottom surface of the channel region 144 at a lower level than the first conductive plate 114. The channel region 144 may be apart from the substrate 110 with the lowest portion of the gate dielectric layer 142 therebetween. The sidewalls of the channel region 144 may be configured to be in contact with the first conductive plate 114 and electrically connected to the first conductive plate 114.

As illustrated in FIGS. 5A and 5D, the channel region 144 may have a cylinder shape. The channel region 144 may include doped polysilicone or undoped polysilicone. The buried insulating layer 146 may fill an internal space of the channel region 144. The buried insulating layer 146 may include an insulating material. For example, the buried insulating layer 146 may include silicon oxide, silicon nitride, silicon oxynitride, or a combination thereof. In embodiments, the buried insulating layer 146 may be omitted. In this case, the channel region 144 may have a pillar structure without an internal space.

As illustrated in FIG. 5A, a plurality of drain regions 148 may be insulated from each other by a first upper insulating layer UL1 covering the third stack STC. The plurality of drain regions 148 may include a doped polysilicon layer.

As illustrated in FIGS. 5A through 5C, in the memory cell region MEC and the connection region CON, a second upper insulating layer UL2 and a third upper insulating layer UL3 may be sequentially formed on the plurality of channel structures 140 and the first upper insulating layer UL1. Each of the first upper insulating layer UL1, the second upper insulating layer UL2, and the third upper insulating layer UL3 may include an oxide layer, a nitride layer, or a combination thereof.

As illustrated in FIGS. 4 and 5A, the plurality of bit lines BL may be arranged on the second upper insulating layer UL2 of the memory stack structure MST in the memory cell region MEC of the chip region CR. The plurality of bit lines BL may extend in parallel with each other in the second horizontal direction (Y direction). A space between each of the plurality of bit lines BL may be filled with the third upper insulating layer UL3 (refer to FIGS. 5B and 5C). The drain region 148 of each of the plurality of channel structures 140 may be connected to the bit line BL via a contact plug 176 penetrating the second upper insulating layer UL2.

As illustrated in FIGS. 5B and 5C, in the connection region CON of the chip region CR, the insulating plate 112 and the second conductive plate 118 may be sequentially stacked on the substrate 110. The insulating plate 112 may have a multilayer structure including a first insulating layer 112A, a second insulating layer 112B, and a third insulating layer 112C, which are sequentially stacked on the substrate 110. In embodiments, the first insulating layer 112A and the third insulating layer 112C may include a silicon oxide layer, and the second insulating layer 112B may include a silicon nitride layer.

In the connection region CON, the conductive pad unit 130A having the thickness in the vertical direction (Z direction) greater than that of other portion of the gate line 130 may be formed at one end of each of the plurality of gate lines 130 included in the first stack STA and the second stack STB. Although not illustrated in the drawings, the plurality of gate lines 130 and the conductive pad unit 130A at one end of each of the plurality of gate lines 130 may be formed in the third stack STC also. The conductive pad unit 130A may be integrally connected to an edge portion which is furthest from the memory cell region MEC of the gate line 130. Although only the conductive pad units 130A connected to one ends of some gate lines 130 among the plurality of gate lines 130 are illustrated in FIGS. 5A and 5B, other conductive pad units 130A integrally connected to other gate lines 130 may be arranged in another portion not illustrated in FIGS. 5B and 5C.

As illustrated in FIGS. 4 and 5C, a plurality of memory cell contacts MC and a plurality of insulation support structures SP may be arranged in the connection region CON. Each of the plurality of memory cell contacts MC may be electrically connected to one conductive pad unit 130A selected from the plurality of conductive pad units 130A included in the first stack STA and the second stack STB. The plurality of insulation support structures SP may penetrate the first stack STA, the second stack STB, and the third stack STC in the vertical direction (Z direction) to support each of the first stack STA, the second stack STB, and the third stack STC in the connection region CON. Each of the plurality of memory cell contacts MC and the plurality of insulation support structures SP may be referred to as a plug structure.

Some of the memory cell contacts MC selected from the plurality of memory cell contacts MC may be arranged at positions apart from the step-type connection unit STP included in the second stack STB in the horizontal direction (X direction) in FIG. 5A. Some of the memory cell contacts MC among the plurality of memory cell contacts MC may be penetrating the step-type connection unit STP, the lower insulating block 133, the first intermediate insulating layer 135, the second intermediate insulating layer 136, and an upper insulating block 137 in the vertical direction (Z direction), and may be electrically connected to one conductive pad unit 130A among the plurality of conductive pad units 130A included in the first stack STA.

Each of the memory cell contacts MC of the other portion selected from the plurality of memory cell contacts MC may be penetrating the step-type connection unit STP included in the second stack STB in the vertical direction (Z direction), and may be electrically connected to one conductive pad unit 130A selected from the plurality of conductive pad units 130A included in the second stack STB.

As illustrated in FIG. 5C, Each of the plurality of memory cell contacts MC may penetrate at least a portion of the plurality of gate lines 130 and the plurality of insulating layers 132. The plurality of memory cell contacts MC may be arranged in a hole penetrating at least one of the plurality of gate lines 130.

The plurality of insulation support structures SP (refer to FIG. 4) may, similar to the plurality of memory cell contacts MC, penetrate at least portions of the plurality of gate lines 130 and the plurality of insulating layers 132. The plurality of insulation support structures SP may be arranged in a hole penetrating at least one of the plurality of gate lines 130.

Each of the plurality of memory cell contacts MC may be connected to one gate line 130 selected from the plurality of gate lines 130, and may not be connected to other gate lines 130 except for the selected one gate line 130. The plurality of memory cell contacts MC may be in contact with the conductive pad unit 130A of one gate line 130 selected from the plurality of gate lines 130, and may be connected to the selected one gate line 130 via the conductive pad unit 130A.

In embodiments, each of the plurality of memory cell contacts MC may include W, titanium, tantalum, copper, aluminum, titanium nitride, tantalum nitride, tungsten nitride, or a combination thereof, but is not limited thereto. Each of the plurality of insulation support structures SP may include silicon oxide, but is not limited thereto.

Each of the plurality of memory cell contacts MC may be apart from other gate lines 130 except for the selected one gate line 130 in the horizontal direction (X direction and/or Y direction). In the first stack STA, a first insulating ring 152A may be arranged between Each of the plurality of memory cell contacts MC and another gate line 130 not connected thereto. In the second stack STB, a second insulating ring 152B may be arranged between each of the plurality of memory cell contacts MC and another gate line 130 not connected thereto. In embodiments, the first insulating ring 152A and the second insulating ring 152B may include a silicon oxide layer, but are not limited thereto.

As illustrated in FIGS. 4 and 5B, a plurality of dummy channel structures 140D may be arranged in the connection region CON. The plurality of dummy channel structures 140D may include the plurality of dummy channel structures 140D penetrating the step-type connection unit STP included in the first stack STA in the vertical direction (Z direction), and the plurality of dummy channel structures 140D penetrating the step-type connection unit STP and the first and second intermediate insulating layers 135 and 136 included in each of the first stack STA and the second stack STB in the vertical direction (Z direction). FIG. 5B illustrates a case in which the plurality of dummy channel structures 140D penetrate the conductive pad unit 130A included in the step-type connection unit STP in the vertical direction (Z direction), but technical ideas of inventive concepts are not limited thereto. For example, at least some of a plurality of dummy structures 140D may also penetrate, in the vertical direction (Z direction), a portion of the gate line 130 apart from the conductive pad unit 130A in the connection region CON in the horizontal direction (X direction and/or Y direction). Each of the plurality of dummy channel structures 140D may be referred to as a plug structure. Some dummy channel structures 140D among the plurality of dummy channel structures 140D may penetrate in the vertical Z direction the step-type connection unit STP, the lower insulating block 133, the first intermediate insulating layer 135, the second intermediate insulating layer 136, the intermediate insulating block 137, and the upper insulating block 137A, which are included in the first stack STA. Some other dummy channel structures 140D among the plurality of dummy channel structures 140D may penetrate in the vertical direction (Z direction) the step-type connection unit STP, the first intermediate insulating layer 135, the second intermediate insulating layer 136, the step-type connection unit STP included in the second stack STB, the intermediate insulating block 137, and the upper insulating block 137A, which are included in the first stack STA.

In the connection region CON, the plurality of dummy channel structures 140D may be arranged apart from each other at a certain interval therebetween in the first horizontal direction (X direction) and the second horizontal direction (Y direction). Each of the plurality of dummy channel structures 140D may, similar to the channel structure 140 arranged in the memory cell region MEC, include the gate dielectric layer 142, the channel region 144, the buried insulating layer 146, and the drain region 148. However, a planar size of each of the plurality of dummy channel structures 140D may be greater than that of the channel structure 140. The number and arrangement shape of the plurality of dummy channel structures 140D illustrated in FIG. 4 are only examples, but the embodiment is not limited thereto. In the connection region CON, the plurality of dummy channel structures 140D may be arranged in various arrangements at various positions selected in the memory stack structure MST.

As illustrated in FIGS. 5B and 5C, in the connection region CON, the upper insulating block 137A may be covered with the first upper insulating layer UL1. In the connection region CON, the plurality of dummy channel structures 140D may be covered with the second upper insulating layer UL2.

As illustrated in FIGS. 4 and 5C, in the connection region CON, a conductive plate contact 164 may be arranged. The conductive plate contact 164 may penetrate the upper insulating block 137A, the intermediate insulating block 137A, the first and second intermediate insulating layers 135 and 136, the lower insulating block 133, the second conductive plate 118, and the insulating plate 112, and extend in the vertical direction (Z direction) to the substrate 110. The sidewalls of the conductive plate contact 164 may be covered with an insulating spacer 162. The insulating spacer 162 may include a silicon oxide layer.

Each of the plurality of memory cell contacts MC and the conductive plate contact 164 may be connected to one upper wiring layer UML among a plurality of upper wiring layers UML via a contact plug 172 penetrating the first upper insulating layer UL1 and the second upper insulating layer UL2. The plurality of upper wiring layers UML may be arranged at the same level as the plurality of bit lines BL in the memory cell region MEC. A space between each of the plurality of upper wiring layers UML may be filled with the third upper insulating layer UL3.

The uppermost surface of each of the plurality of memory cell contacts MC, the plurality of insulation support structures SP, and the conductive plate contact 164 may extend at approximately the same vertical level. In embodiments, each of the conductive plate contact 164, the plurality of contact plugs 172, the plurality of contact plugs 176, the plurality of upper wiring layers UML, and the plurality of bit lines BL may include W, titanium, tantalum, copper, aluminum, titanium nitride, tantalum nitride, tungsten nitride, or a combination thereof, but is not limited thereto.

As illustrated in FIGS. 4 and 5C, in the chip region CR of the semiconductor device 100, the memory cell blocks BLK11 and BLK12 may include a through electrode region TA including a plurality of through electrodes THV arranged in the connection region CON. Each of the plurality of through electrodes THV may be referred to as a plug structure.

Each of the plurality of through electrodes THV may penetrate at least one of the step-type connection unit STP included in the first stack STA and the step-type connection unit STP included in the second stack STB in the vertical direction (Z direction). The plurality of through electrodes THV may be configured not to be electrically connected to the gate line 130 and the conductive pad unit 130A included in the first stack STA and the second stack STB.

As illustrated in FIG. 5C, a portion of the through electrode THV selected from the plurality of through electrodes THV may include a portion surrounded by the lower insulating block 133, a portion surrounded by the first and second intermediate insulating layers 135 and 136, and a portion surrounded by the upper insulating block 137A. In the connection region CON, the uppermost surface of each of the plurality of memory cell contacts MC, the plurality of through electrodes THV, and the conductive plate contact 164 may extend at approximately the same vertical level.

The plurality of through electrodes THV may penetrate at least a portion of each of the plurality of gate lines 130 and the plurality of insulating layers 132. The plurality of through electrodes THV may be arranged in a hole penetrating at least one of the plurality of gate lines 130. Each of a plurality of through electrodes THV may not be connected to the gate line 130. Each of a plurality of through electrodes THV may be apart from the gate line 130 in the horizontal direction (X direction and/or Y direction). Each of the plurality of through electrodes THV may include W, titanium, tantalum, copper, aluminum, titanium nitride, tantalum nitride, tungsten nitride, or a combination thereof, but is not limited thereto.

In the first stack STA, the first insulating ring 152A may be arranged between the plurality of through electrodes THV and the gate line 130 adjacent thereto. When the plurality of through electrodes THV penetrate the second stack STB, in the second stack STB, the second insulating ring 152B may be arranged between the plurality of through electrodes THV and the gate line 130 adjacent thereto.

Figure 6:
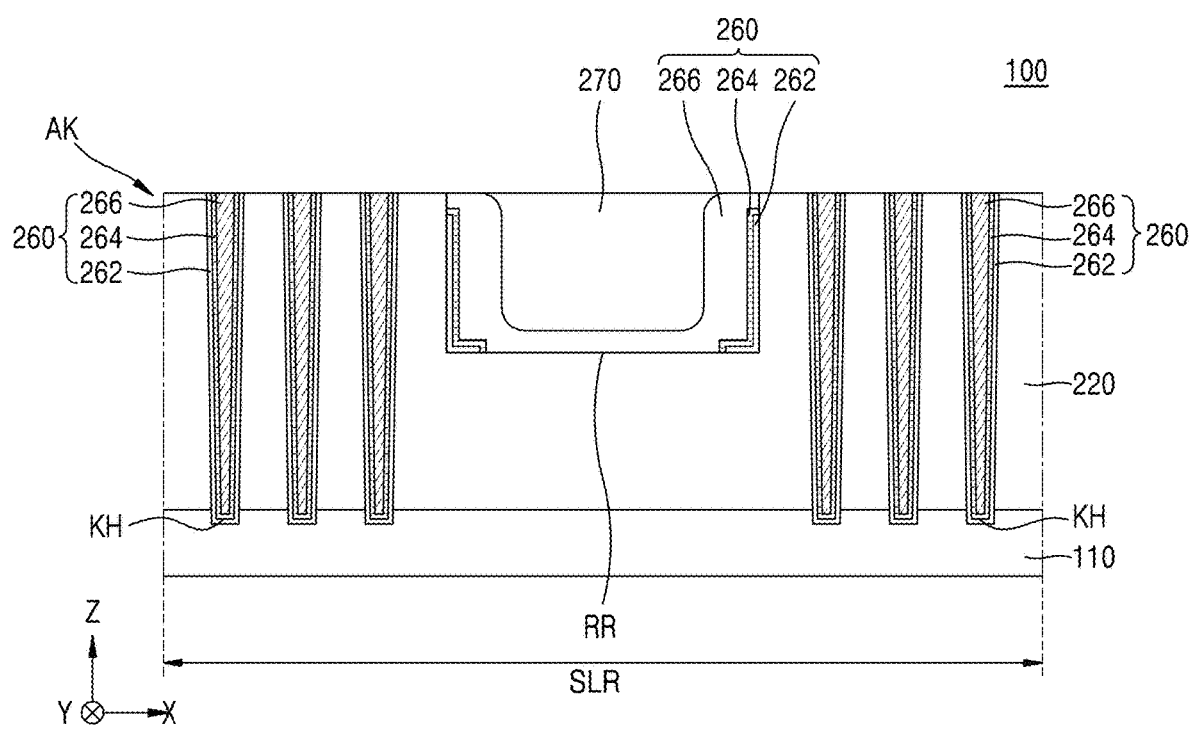
FIG. 6 is a cross-sectional view illustrating some components of a scribe lane region of a semiconductor device, according to an embodiment.

FIG. 6 is a cross-sectional view of some components of the scribe lane region SLR (refer to FIG. 1) of the semiconductor device 100.

Referring to FIG. 6, in the scribe lane region SLR of the semiconductor device 100, an insulating structure 220 may be arranged on the substrate 110. On an upper surface of the insulating structure 220, a recess region RR and a plurality of key holes KH to form an alignment key AK may be formed. In embodiments, the insulating structure 220 may include the same material as one selected from the lower insulating block 133, the first intermediate insulating layer 135, the second intermediate insulating layer 136, and the intermediate insulating block 137 in the chip region CR.

An alignment key structure 260 may be arranged inside each of the recess region RR and the plurality of key holes KH. The alignment key structure 260 may constitute the alignment key AK.

The alignment key structure 260 inside each of the recess region RR and the plurality of key holes KH may include a carbon layer 262 and sacrificial metal layers 264 and 266. In the recess region RR, the carbon layer 262 may be selectively deposited on a portion, where the silicon nitride layer is exposed, on internal sidewalls of the recess region RR. Inside each of the plurality of key holes KH, the carbon layer 262 may be formed to be selectively deposited on the portion, where the silicon nitride layer is exposed, on an inner surface of each of the plurality of key holes KH. The carbon layer 262 formed in the scribe lane region SLR may have a thickness of about 5 nm to about 15 nm. The carbon layer 262 may be in contact with the insulating structure 220 inside each of the recess region RR and the plurality of key holes KH. Bottom surfaces of the sacrificial metal layers 264 and 266 may be in contact with the carbon layer 262 inside each of the recess region RR and the plurality of key holes KH. Portions of the sacrificial metal layers 264 and 266 in the recess region RR may cover a bottom surface of the recess region RR and the sidewalls of the carbon layer 262 with the same thickness. Portions among the sacrificial metal layers 264 and 266 inside the plurality of key holes KH may fill an entrance-side space of each of the plurality of key holes KH on the carbon layer 262.

The carbon layer may include pure carbon atoms, but may include some hydrogen impurities. In an embodiment, the titanium nitride layer 263 may be a portion of the sacrificial metal layer 266, but is not limited thereto. In an embodiment, the sacrificial metal layer 266 may include W, but is not limited thereto. In the recess region RR, spaces on the sacrificial metal layers 264 and 266 may be filled with an insulating layer 270. The insulating layer 270 may include a silicon oxide layer, a silicon nitride layer, or a combination thereof.

The alignment key AK including the alignment key structure 260 illustrated in FIG. 6 may be simultaneously formed with formation of a sacrificial structure filling the inside of a vertical hole required for forming one plug structure, among processes for forming at least one plug structure selected from the plug structure arranged in the chip region CR of the semiconductor device 100, for example, the plurality of channel structures 140, the plurality of memory cell contacts MC, the plurality of insulation support structures SP, the plurality of dummy structures 140D, and the plurality of through electrodes THV.

Figure 7A:
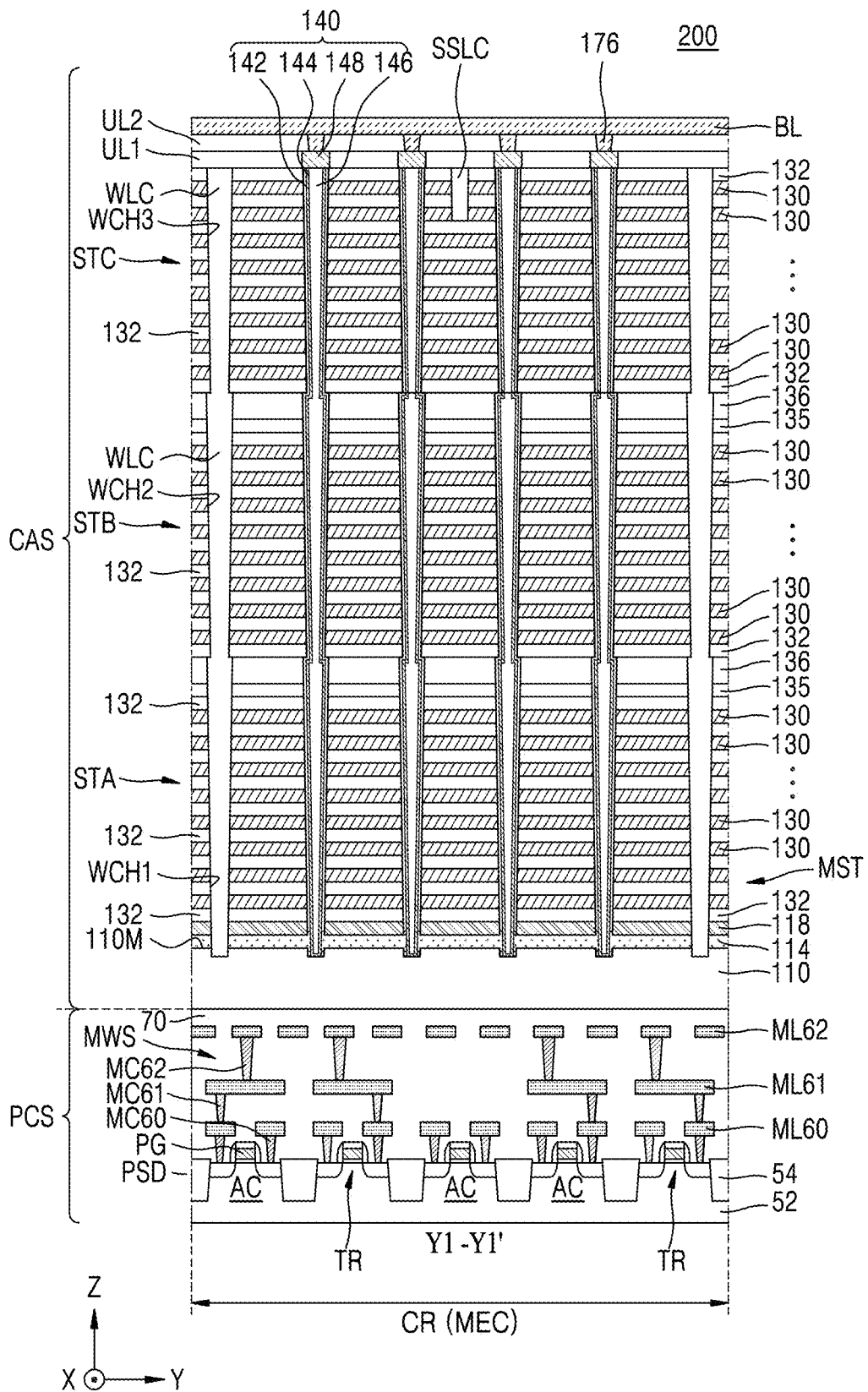
FIGS. 7A, 7B, and 7C are cross-sectional views of illustrative components in a chip region of a semiconductor device, according to other embodiments.
Figure 7B:
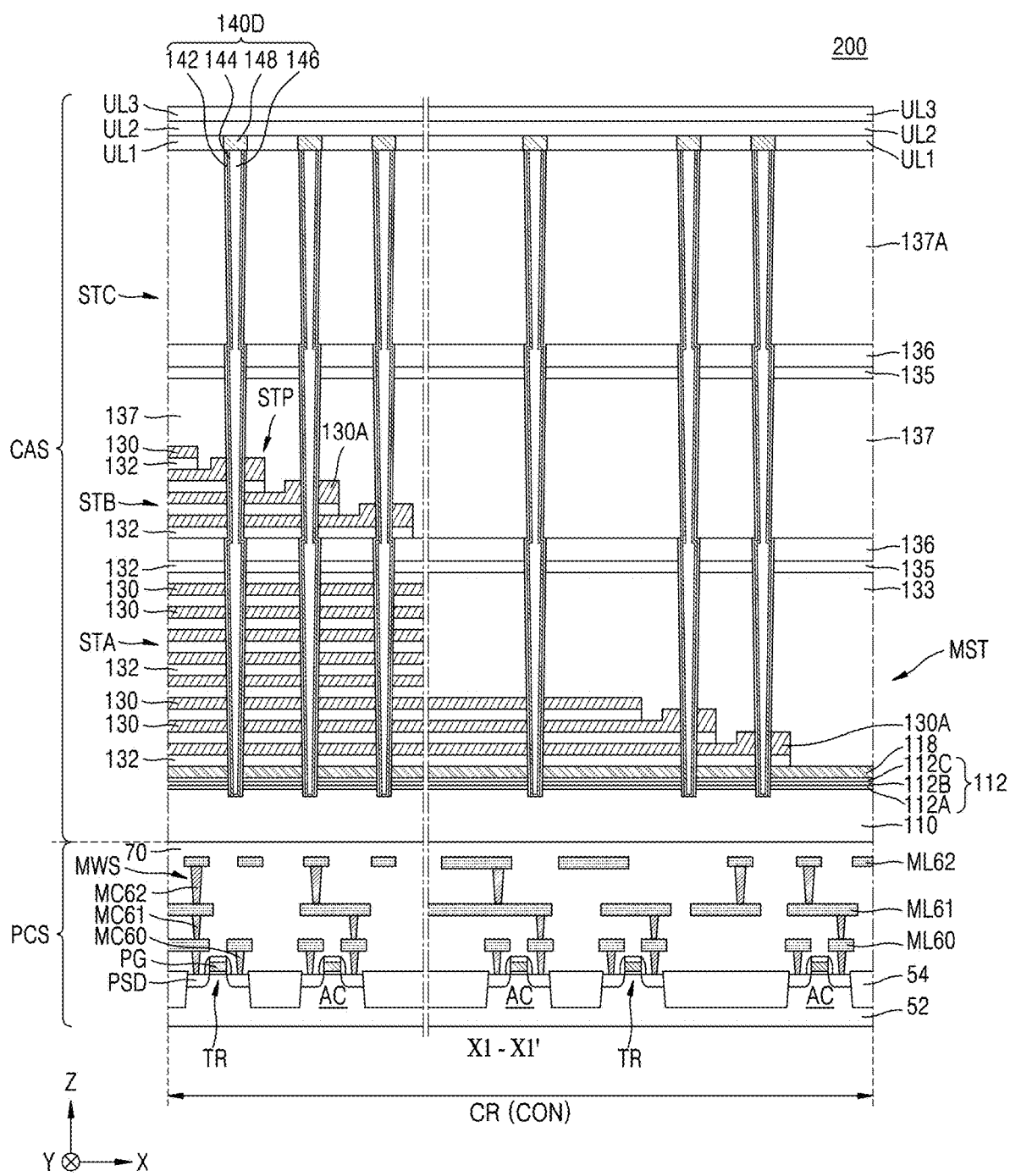
Figure 7C:
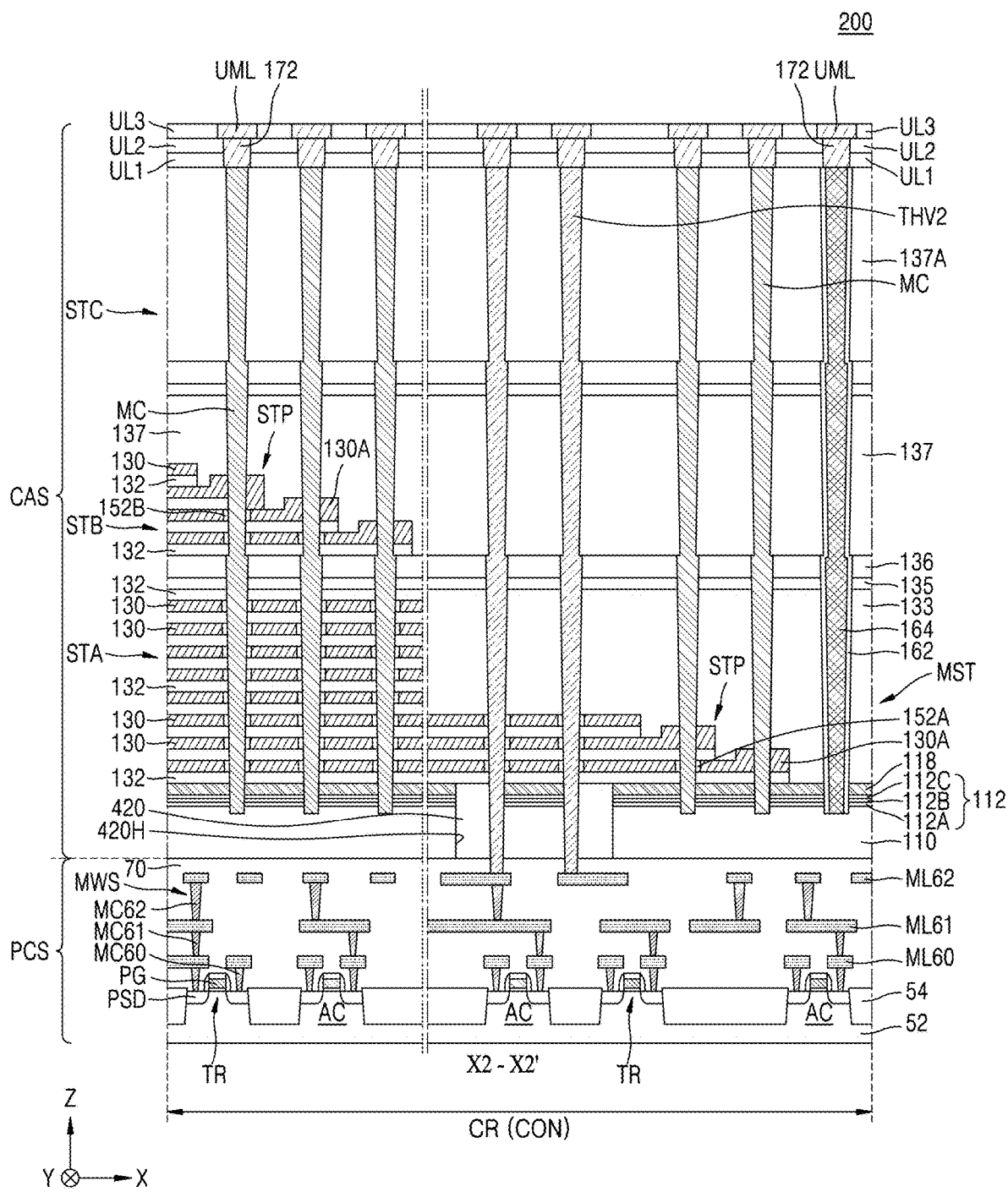

FIGS. 7A, 7B, and 7C are cross-sectional views of illustrative components in the chip region CR of a semiconductor device 200, according to other embodiments. FIG. 7A illustrates some components in a portion corresponding to a cross-section taken along line Y1-Y1' in FIG. 4, FIG. 7B illustrates some components in a portion corresponding to a cross-section taken along line X1-X1' in FIG. 4, and FIG. 7A illustrates some components in a portion corresponding to a cross-section taken along line X2-X2' in FIG. 4. In FIGS. 7A, 7B, and 7C, the same reference numerals as in FIGS. 1 through 6 may denote the same members, and detailed explanations thereof are omitted.

Referring to FIGS. 7A, 7B, and 7C, the chip region CR of the semiconductor device 200 may have substantially the same configuration as the semiconductor device 100 described with reference to FIGS. 1 through 6. However, the chip region CR of the semiconductor device 200 may include the cell array structure CAS and a periphery circuit structure PCS, which overlap each other in the vertical direction (Z direction). The cell array structure CAS may include the memory stack structure MST described with reference to FIGS. 3 and 5A through 5C. The memory stack structure MST of the cell array structure CAS may have substantially the same configuration as described with reference to FIGS. 4 and 5A to 5D.

The periphery circuit structure PCS may include a lower substrate 52, a plurality of periphery circuits formed on the lower substrate 52, and a multilayer wiring structure MWS for interconnecting the plurality of periphery circuits or connecting the plurality of periphery circuits to components in the memory cell region MEC.

The lower substrate 52 may include a semiconductor substrate. For example, the lower substrate 52 may include Si, Ge, or SiGe. An active region AC may be defined on the lower substrate 52 by the device separation layer 54. A plurality of transistors TR constituting the plurality of periphery circuits may be formed on the active region AC. Each of the plurality of transistors TR may include a gate PG and a plurality of ion implantation regions PSD formed in the active region AC on both sides of the gate PG. Each of the plurality of ion implantation regions PSD may constitute a source region or a drain region of the transistor TR.

In embodiments, the plurality of periphery circuits included in the periphery circuit structure PCS may include, a row decoder, a page buffer, a data input/output circuit, control logic, a common source line driver, or the like, but are not limited thereto.

The multilayer wiring structure MWS included in the periphery circuit structure PCS may include a plurality of periphery circuit wiring layers ML60, ML61, and ML62 and a plurality of periphery circuit contacts MC60, MC61, and MC62. At least some of the plurality of periphery circuit wiring layers ML60, ML61, and ML62 may be configured to be electrically connected to the transistor TR. Some of the plurality of periphery circuit contacts MC60, MC61, and MC62 may be respectively configured to be interconnected to the plurality of transistors TR.

Although FIGS. 7A, 7B, and 7C illustrate that the multilayer wiring structure MWS has three or more wiring layers in the vertical direction (Z direction), the embodiment is not limited thereto, and the multilayer wiring structure MWS may have three or more wiring layers.

Each of the plurality of periphery circuit wiring layers ML60, ML61, and ML62 and the plurality of periphery circuit contacts MC60, MC61, and MC62 may include a metal, conductive metal nitride, metal silicide, or a combination thereof. For example, each of the plurality of periphery circuit wiring layers ML60, ML61, and ML62, and the plurality of periphery circuit contacts MC60, MC61, and MC62 may include a conductive material, such as tungsten, molybdenum, titanium, tantalum, nickel, or tungsten silicide, titanium silicide, cobalt silicide, titanium silicide, and nickel silicide.

The plurality of transistors TR and the multilayer wiring structure MWS, which are included in the periphery circuit structure PCS may be covered with an interlayer insulating layer 70. The interlayer insulating layer 70 may include silicon oxide, SiON, SiOCN, or the like.

As illustrated in FIGS. 7B and 7C, the substrate 110 may be arranged on the periphery circuit structure PCS in the connection region CON of the cell array structure CAS, and the insulating plate 112, the second conductive plate 118, the first stack STA, the second stack STB, and the third stack STC may be sequentially stacked on the substrate 110.

As illustrated in FIG. 7C, a plurality of through openings 420H penetrating the substrate 110, the insulating plate 112, and the second conductive plate 118 may be formed in a portion of the connection region CON. Each of a plurality of through openings 420H may be filled with an insulating plug 420. The plurality of through openings 420H may be arranged at positions to overlap a portion of the periphery circuit structure PCS in the vertical direction (Z direction). The insulating plug 420 may include a silicon oxide layer, a silicon nitride layer, or a combination thereof.

In the connection region CON, each of a plurality of through electrodes THV2 may be configured to extend to the periphery circuit structure PCS via the through opening 420H, and be electrically connected to one wiring layer selected from the plurality of periphery circuit wiring layers ML60, ML61, and ML62. For example, each of the plurality of through electrodes THV2 may be configured to be electrically connected to the periphery circuit wiring layer ML62 at the uppermost layer closest to the cell array structure CAS among the plurality of periphery circuit wiring layers ML60, ML61, and ML62. Each of the plurality of through electrodes THV2 may be configured to be connected to at least one periphery circuit among the plurality of periphery circuits via the multilayer wiring structure MWS included in the periphery circuit structure PCS. More detailed descriptions on the configuration of the plurality of through electrodes THV2 may be substantially the same as the descriptions of the plurality of through electrodes THV given with reference to FIGS. 4 and 5C.

Below, a method of manufacturing a semiconductor device according to embodiments is described in detail.

FIGS. 8A through 15C are cross-sectional views for describing a method of manufacturing a semiconductor device, according to embodiments. In particular, FIGS. 8A, 11A, 12A, 13A, 14A, and 15A are cross-sectional views of some components in a portion corresponding to a cross-section along line Y1-Y1' in FIG. 4 according to a process sequence, FIGS. 8B, 9A, 10A, 11B, 12B, 13B, 14B, and 15B are cross-sectional views of some components in a portion corresponding to a cross-section along line X1-X1' in FIG. 4 according to a process sequence, FIGS. 8C, 9B, 10B, 11C, 12C, 13C, 14C, and 15C are cross-sectional views of some components in a portion corresponding to a cross-section along line X2-X2' in FIG. 4 according to a process sequence. FIGS. 10C and 11D are cross-sectional views of some components in the scribe lane region according to a process sequence. With reference to FIGS. 8A through 15C, an illustrative method of manufacturing the semiconductor device 100 illustrated in FIGS. 1 through 6 is described.

Figure 8A:
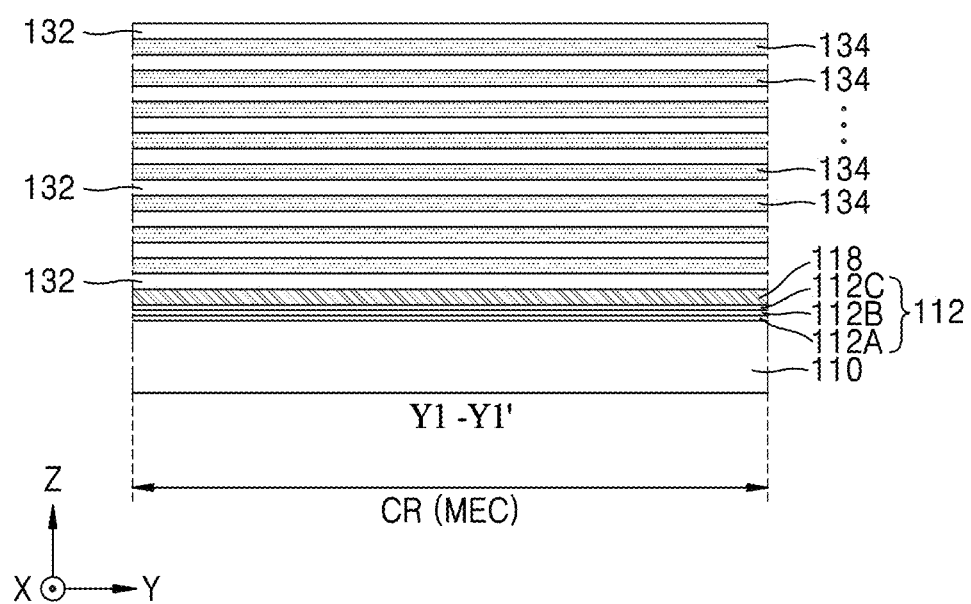
Figure 8B:
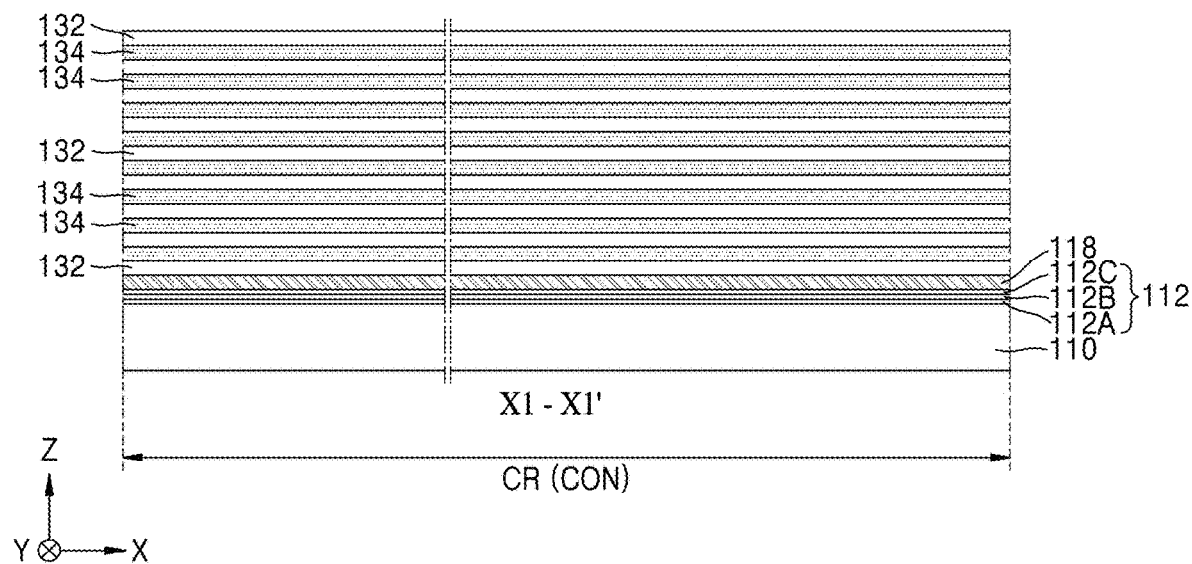
FIGS. 8B, 9A, 10A, 11B, 12B, 13B, 14B, and 15B are cross-sectional views of some components in a portion corresponding to a cross-section along line X1-X1' in FIG. 4 according to a process sequence.
Figure 8C:
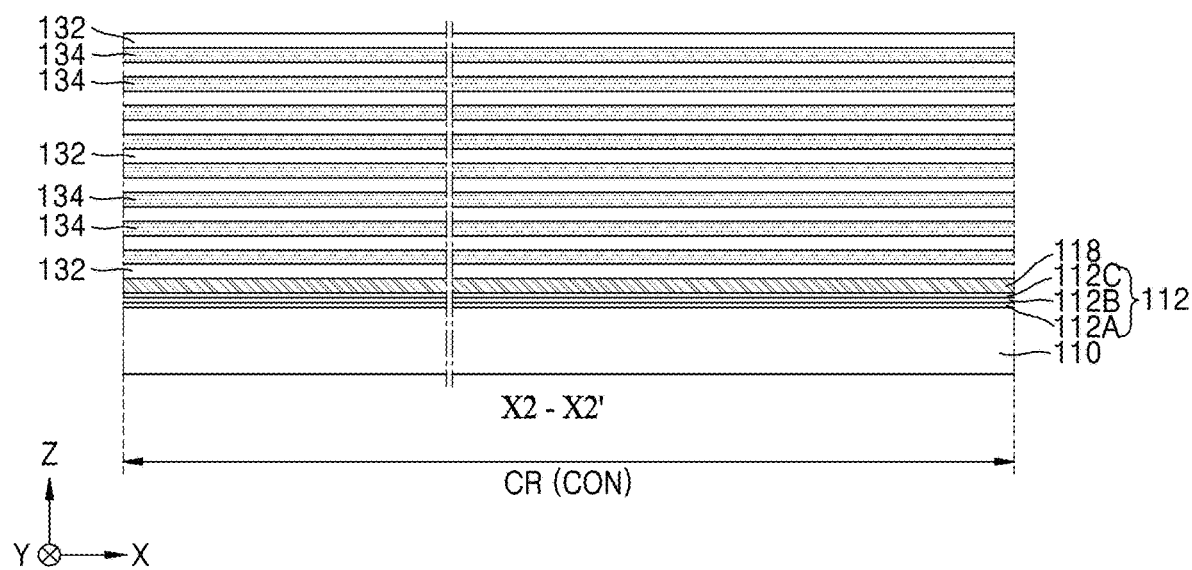

Referring to FIGS. 8A, 8B, and 8C, the insulating plate 112 and the second conductive plate 118 may be sequentially formed on the substrate 110 in the memory cell region MEC and the connection region CON of the chip region CR. The insulating plate 112 may include an insulating layer of a multilayer structure including the first insulating layer 112A, the second insulating layer 112B, and the third insulating layer 112C.

In the memory cell region MEC and the connection region CON of the chip region CR, the plurality of insulating layers 132 and a plurality of sacrificial insulating layers 134 may be alternately stacked one at a time on the second conductive plate 118. The plurality of insulating layers 132 may include a silicon oxide layer, and the plurality of sacrificial insulating layers 134 may include silicon nitride. Each of the plurality of sacrificial insulating layers 134 may secure a space for forming the plurality of gate lines 130 in a subsequent process. A stack formed in the above manner may be referred to as a first stack.

Figure 9A:
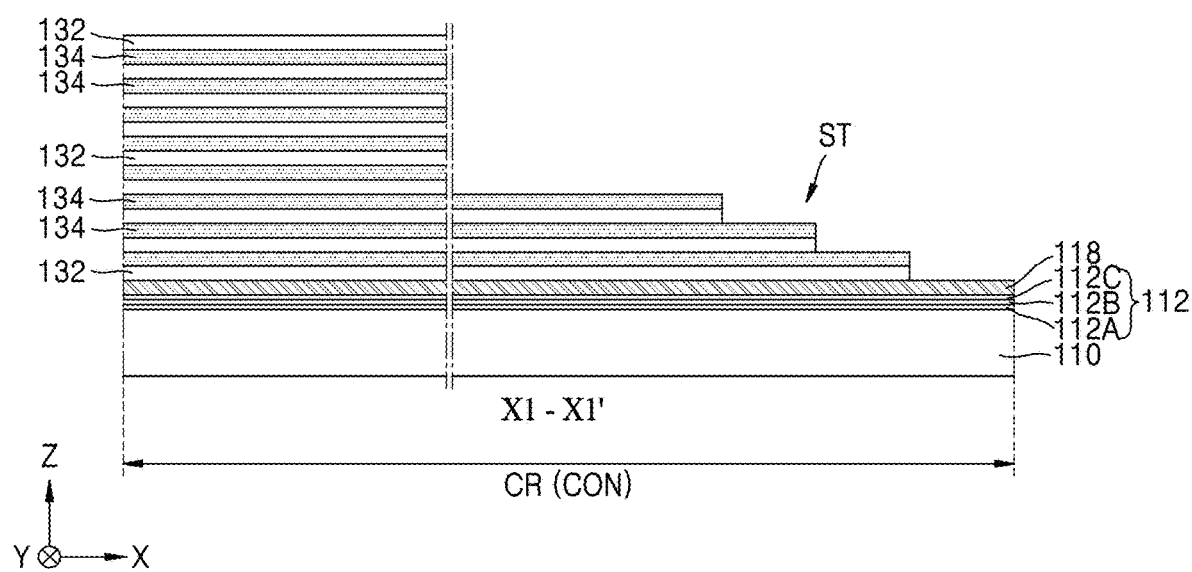
Figure 9B:
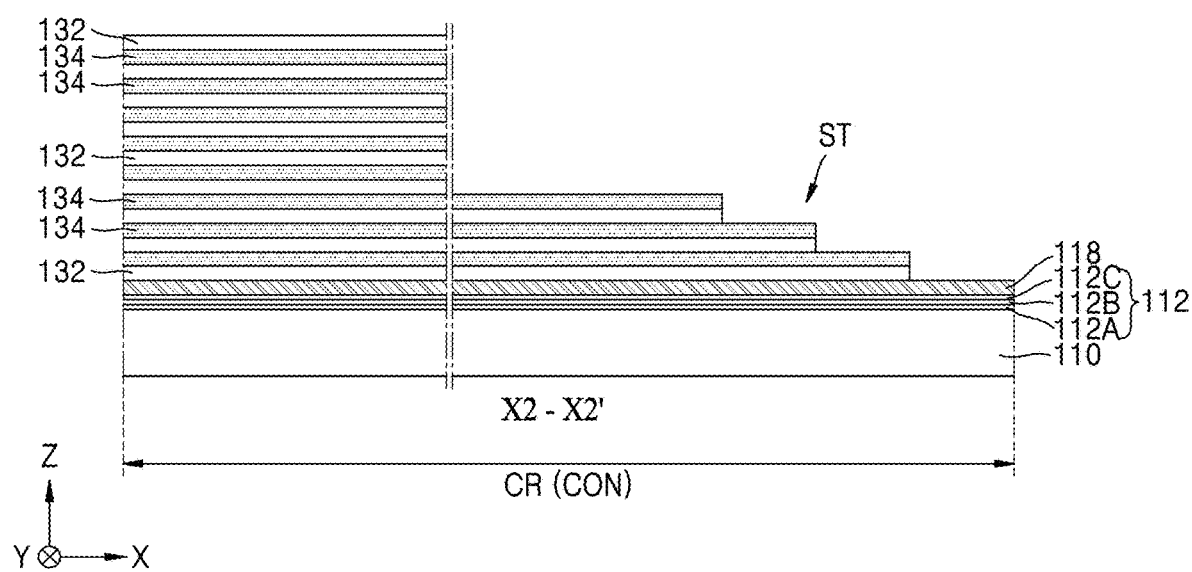

Referring to FIGS. 9A and 9B, from the resultant product of FIGS. 8A, 8B, and 8C, by removing a portion of each of the plurality of insulating layers 132 and the plurality of sacrificial insulating layers 134 in the connection region CON of the chip region CR by using, as an etching mask, an etching prevention layer (not illustrated) covering the insulating layer 132 at the uppermost layer among the plurality of insulating layers 132, a step-type structure ST, in which the width of an end portion of each of the plurality of insulating layers 132 and the plurality of sacrificial insulating layers 134 gradually decreases away from the substrate 110 in the horizontal direction (X direction and/or Y direction), may be formed.

Figure 10A:
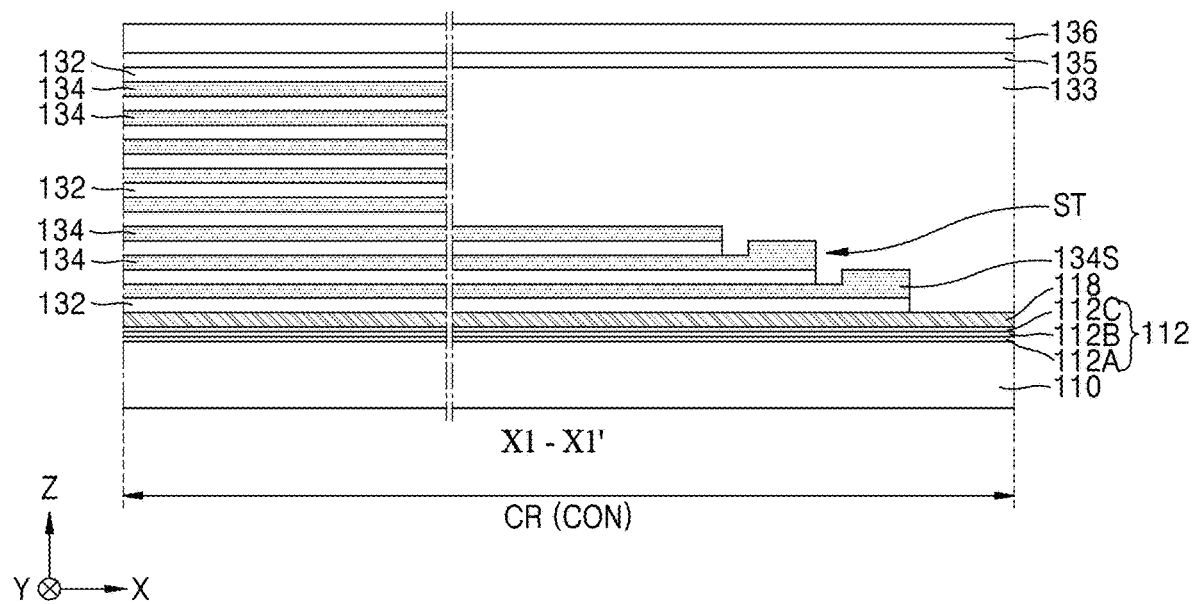
Figure 10B:
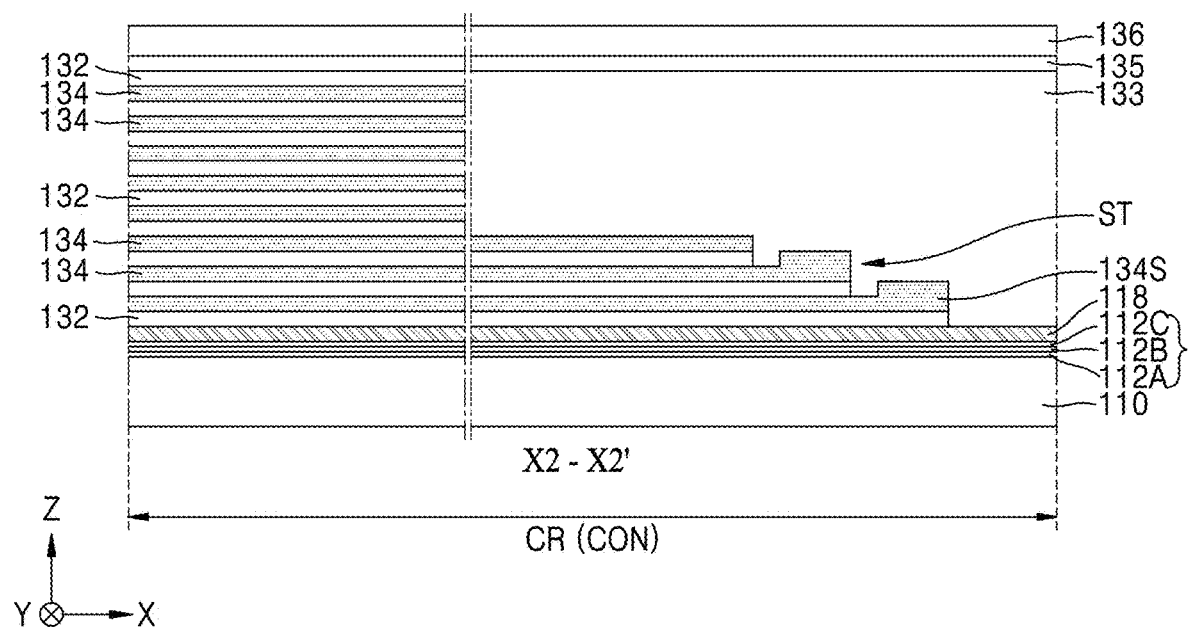
Figure 10C:
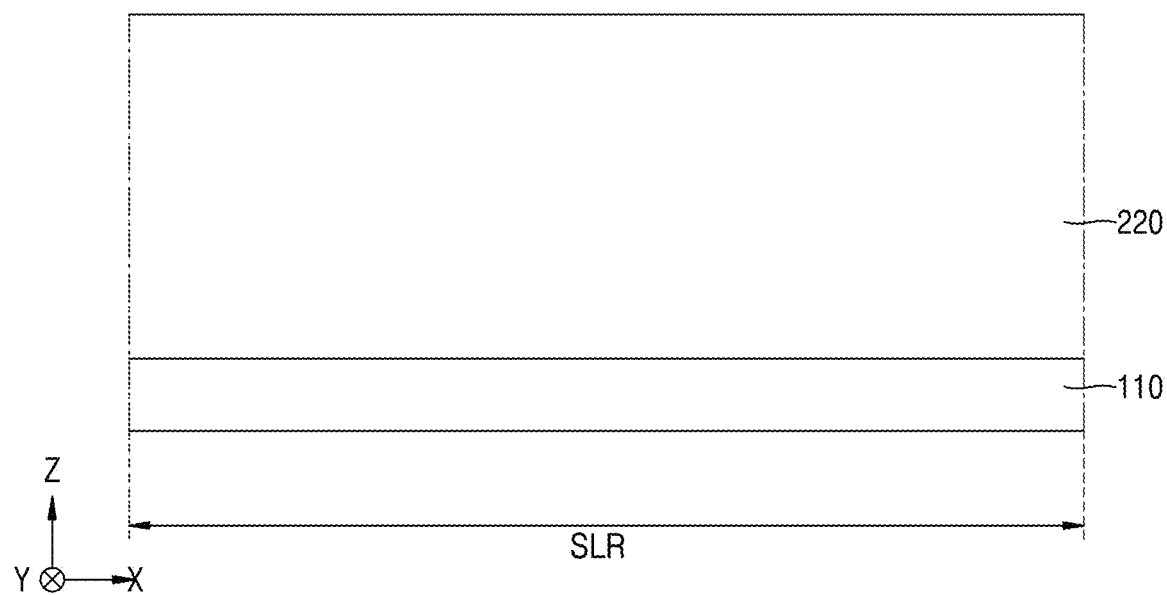
FIGS. 10C and 11D are cross-sectional views of some components in the scribe lane region according to a process sequence.

Referring to FIGS. 10A, 10B, and 10C, a sacrificial pad unit 134S, having an increased thickness at one end of each of the plurality of sacrificial insulating layers 134 forming the step-type structure ST in the connection region CON of the chip region CR, may be formed.

In embodiments, to form a sacrificial pad unit 134S on one end of each of the plurality of sacrificial insulating layers 134, after some of the plurality of insulating layers 132 are removed to expose the one end of each of the plurality of sacrificial insulating layers 134 constituting the step-type structure ST, an additional layer including the same material as that of the plurality of sacrificial insulating layers 134 may be deposited on the exposed one end of Each of the plurality of sacrificial insulating layers 134, and by patterning the additional layer, the sacrificial pad unit 134S may remain.

Thereafter, the lower insulating block 133 covering the step-type structure ST and the second conductive plate 118 may be formed, and the resultant product may be planarized by using a chemical mechanical polishing (CMP) process to remove unnecessary layers thereof, and an upper surface of the insulating layer 132 on the uppermost layer may be exposed. Thereafter, the first intermediate insulating layer 135 and the second intermediate insulating layer 136, which cover the upper surface of each of the insulating layer 132 and the lower insulating block 133, may be sequentially formed.

As illustrated in FIG. 10C, after the second intermediate insulating layer 136 is formed in the chip region CR illustrated in FIGS. 10A and 10B, the insulating structure 220 may remain on the substrate 110 in the scribe lane region SLR. The insulating structure 220 may include the same material as at least one selected from the lower insulating block 133, the first intermediate insulating layer 135, and the second intermediate insulating layer 136 in the chip region CR.

Referring to FIGS. 11A, 11B, 11C, and 11D, by performing a dry etching on the second intermediate insulating layer 136, the first intermediate insulating layer 135, the lower insulating block 133, a stacked structure of the plurality of insulating layers 132 and the plurality of sacrificial insulating layers 134, the second conductive plate 118, and the insulating plate 112, in the connection region CON and the memory cell region MEC of the chip region CR, a plurality of lower vertical holes may be formed.

Figure 11A:
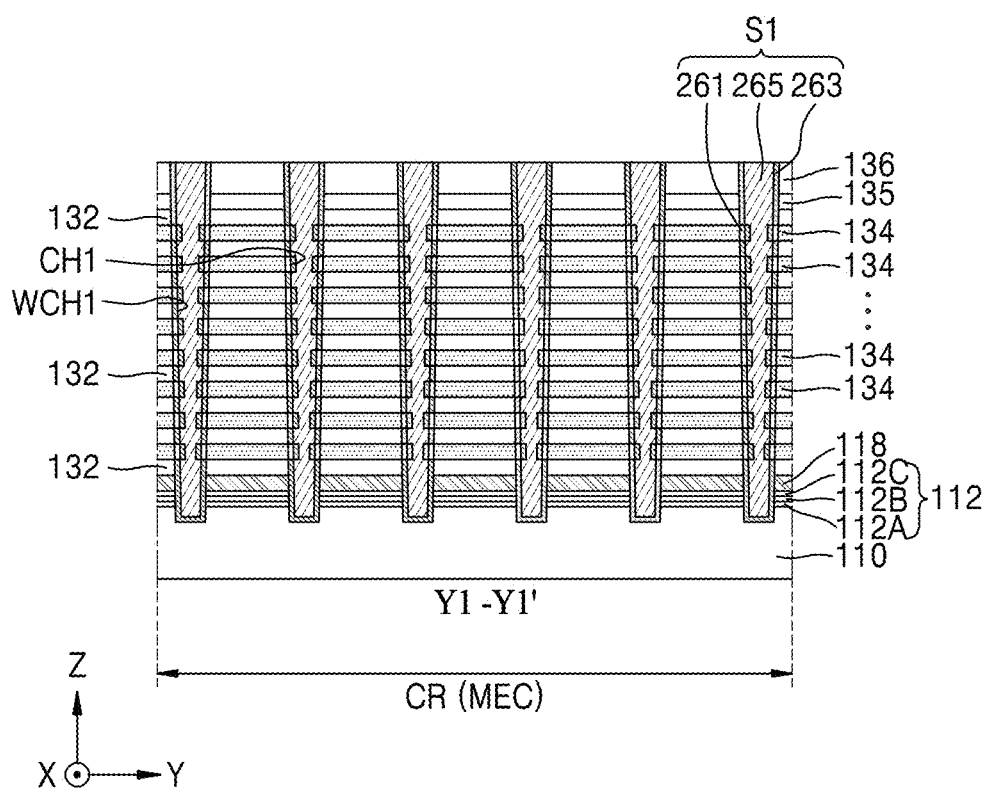
Figure 11B:
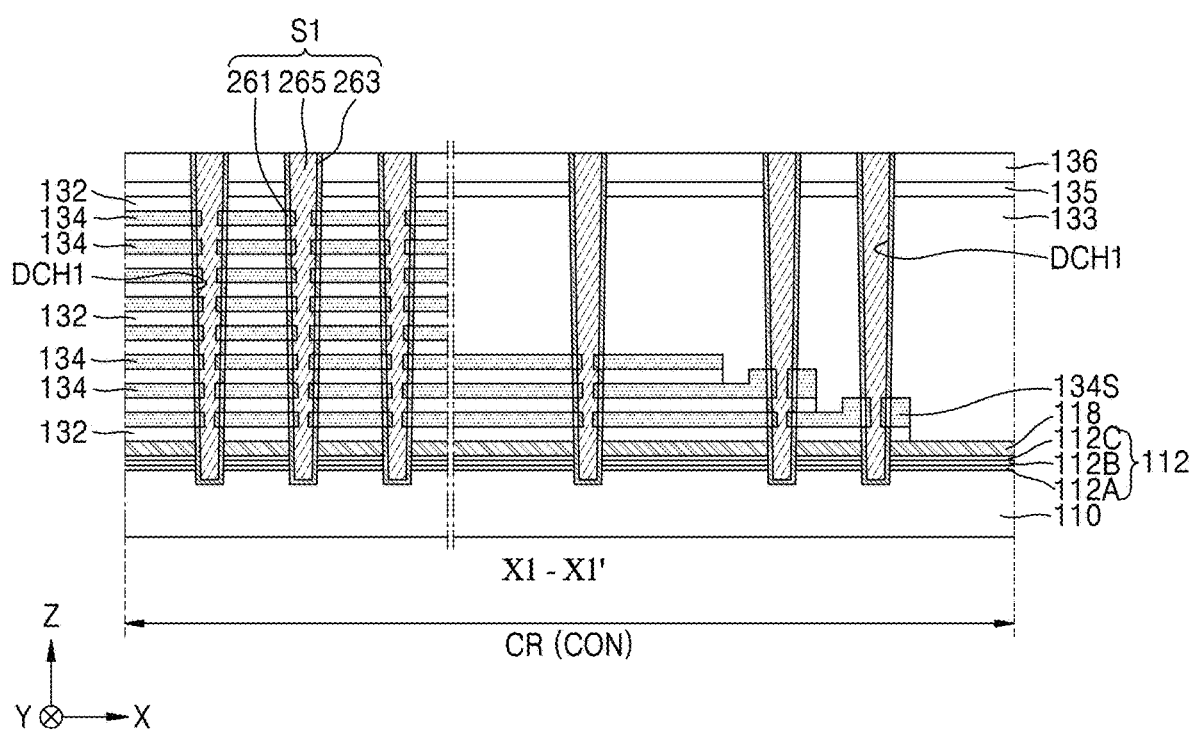
Figure 11C:
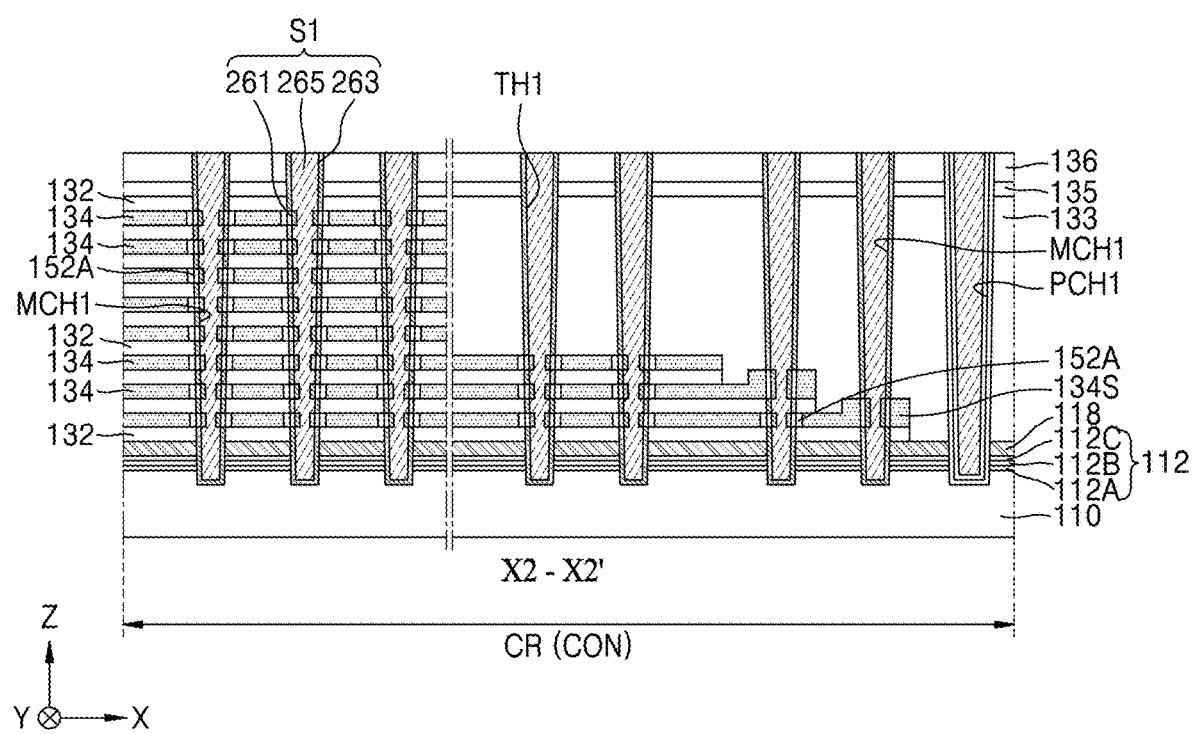

In the chip region CR, as illustrated in FIGS. 11A, 11B, and 11C, the plurality of lower vertical holes may include a plurality of lower channel holes CH1 and a plurality of lower word line cut holes WCH1 arranged in the memory cell region MEC, and a plurality of lower dummy channel holes DCH1, a lower plate contact hole PCH1, and a plurality of lower through holes TH1 arranged in the connection region CON. Although not illustrated in FIGS. 11A, 11B, and 11C, the plurality of lower vertical holes may further include lower vertical holes required for forming the plurality of insulation support structures SP illustrated in FIG. 4 in the connection region CON of the chip region CR.

Thereafter, as illustrated in FIG. 11C, by etching portions of the sacrificial pad unit 134S and the sacrificial insulating layer 134 exposed inside each of the plurality of lower memory cell contact holes MCH1 and the plurality of lower through holes TH1, a horizontal direction width of each of the plurality of lower memory cell contact holes MCH1 and the plurality of lower through holes TH1 may be expanded at the same vertical level as the sacrificial insulating layer 134, a plurality of indented spaces, from which sidewalls of the sacrificial pad unit 134S and the sacrificial insulating layer 134 are exposed, may be formed, the indented space exposing the sacrificial insulating layer 134 among the plurality of indented spaces may be filled with the first insulating ring 152A, and the indented space exposing the sacrificial pad unit 134S may be filled with the sacrificial pad unit 134S again.

Thereafter, as illustrated in FIGS. 11A, 11B, and 11C, a plurality of lower sacrificial structures S1 filling the plurality of lower vertical holes may be formed. To form the plurality of lower sacrificial structures S1, firstly, a carbon layer 261 selectively deposited on the exposed portion of the sacrificial insulating layer 134 on internal sidewalls of each of the plurality of lower vertical holes may be formed, and then, sacrificial metal layers 263 and 265 including titanium nitride may be formed on a carbon layer 261. The sacrificial metal layers 263 and 265 may fill a remaining space of Each of the plurality of lower vertical holes. In particular, the sacrificial metal layer 263, which includes titanium nitride, may be in contact with the carbon layer 261. The depositing carbon layer 261 may be deposited with a deposition process using an acetylene ($C_2H_2$) gas at a temperature of 500° C. or higher.

Figure 11D:
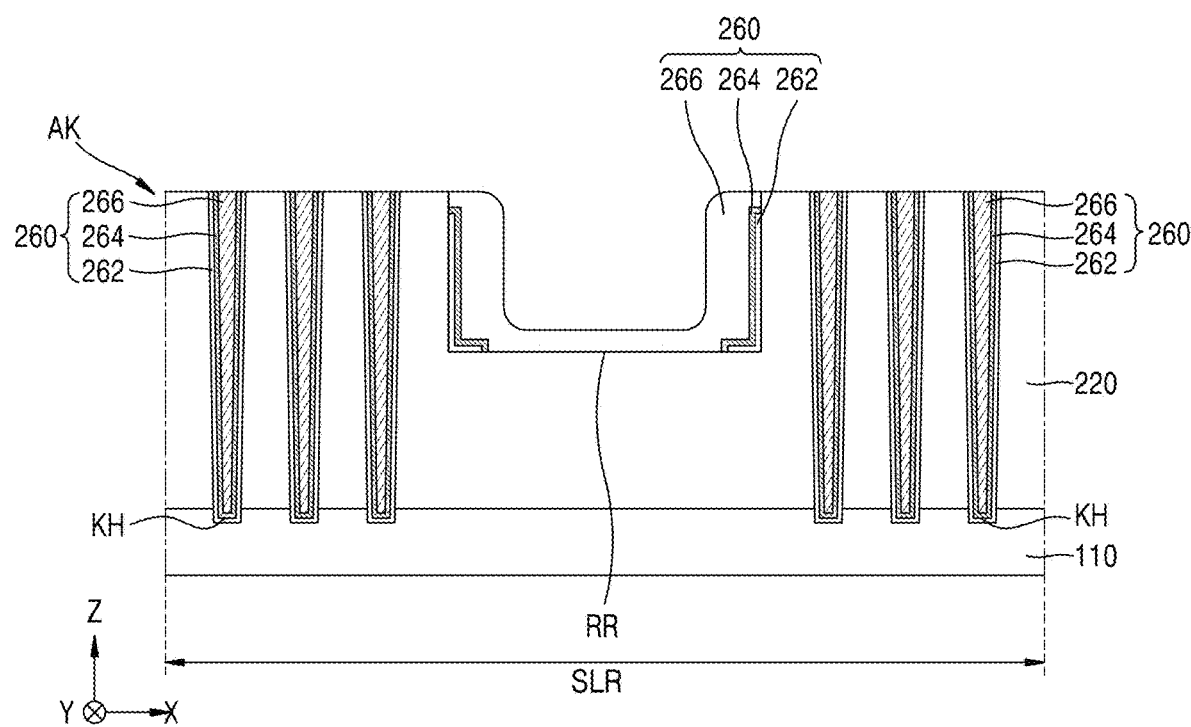

As illustrated in FIGS. 11A, 11B, and 11C, while the sacrificial metal layers 263 and 265 are formed in the chip region CR, as illustrated in FIG. 11D, the sacrificial metal layers 264 and 266 may be formed on the carbon layer 262 in the scribe lane region SLR. A bottom surface of the sacrificial metal layer 263, which includes titanium nitride, may be in contact with an upper surface of the carbon layer 262. The sacrificial metal layers 263, 264, 265, and 266 may be simultaneously formed.

Figure 12A:
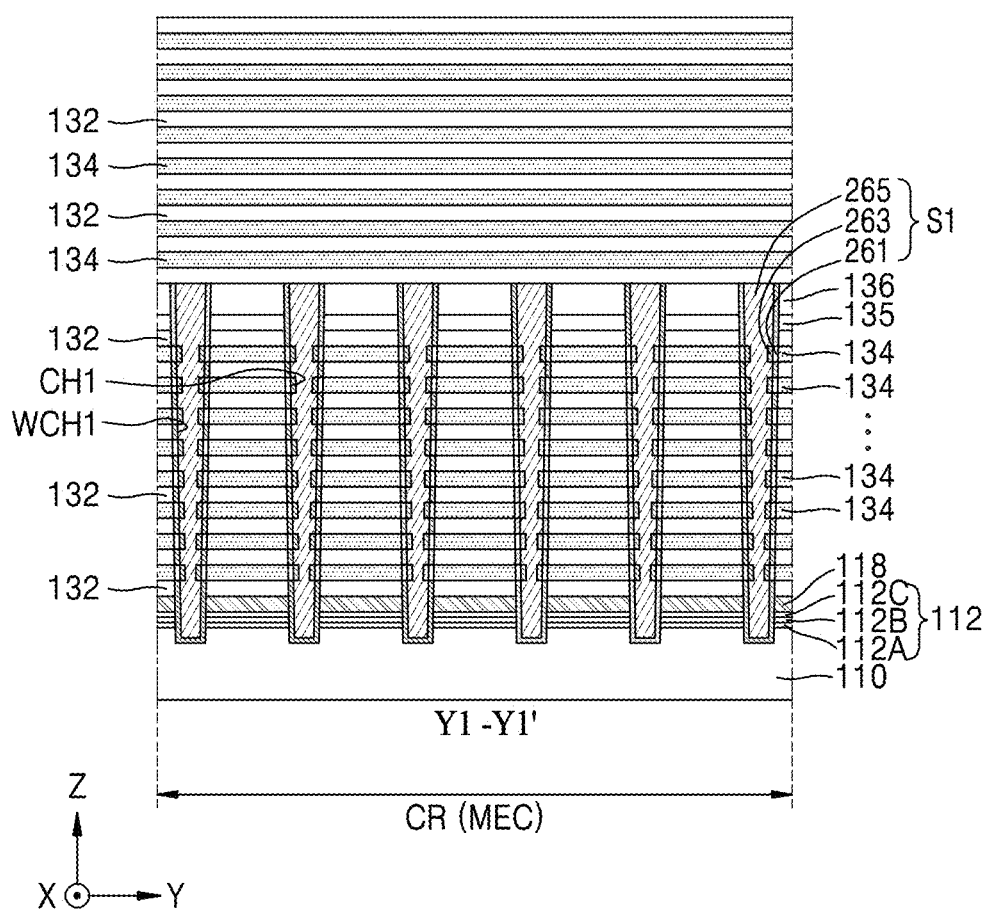
Figure 12B:
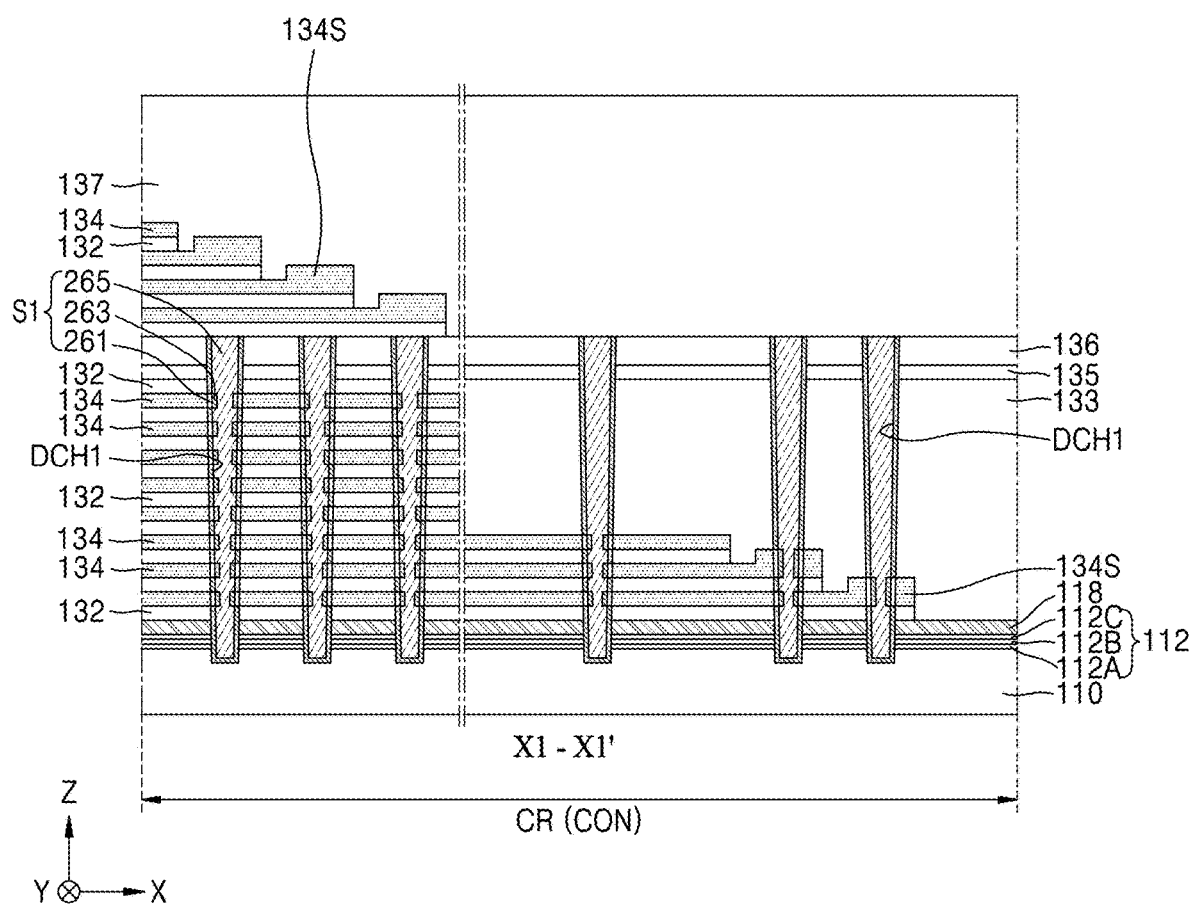
Figure 12C:
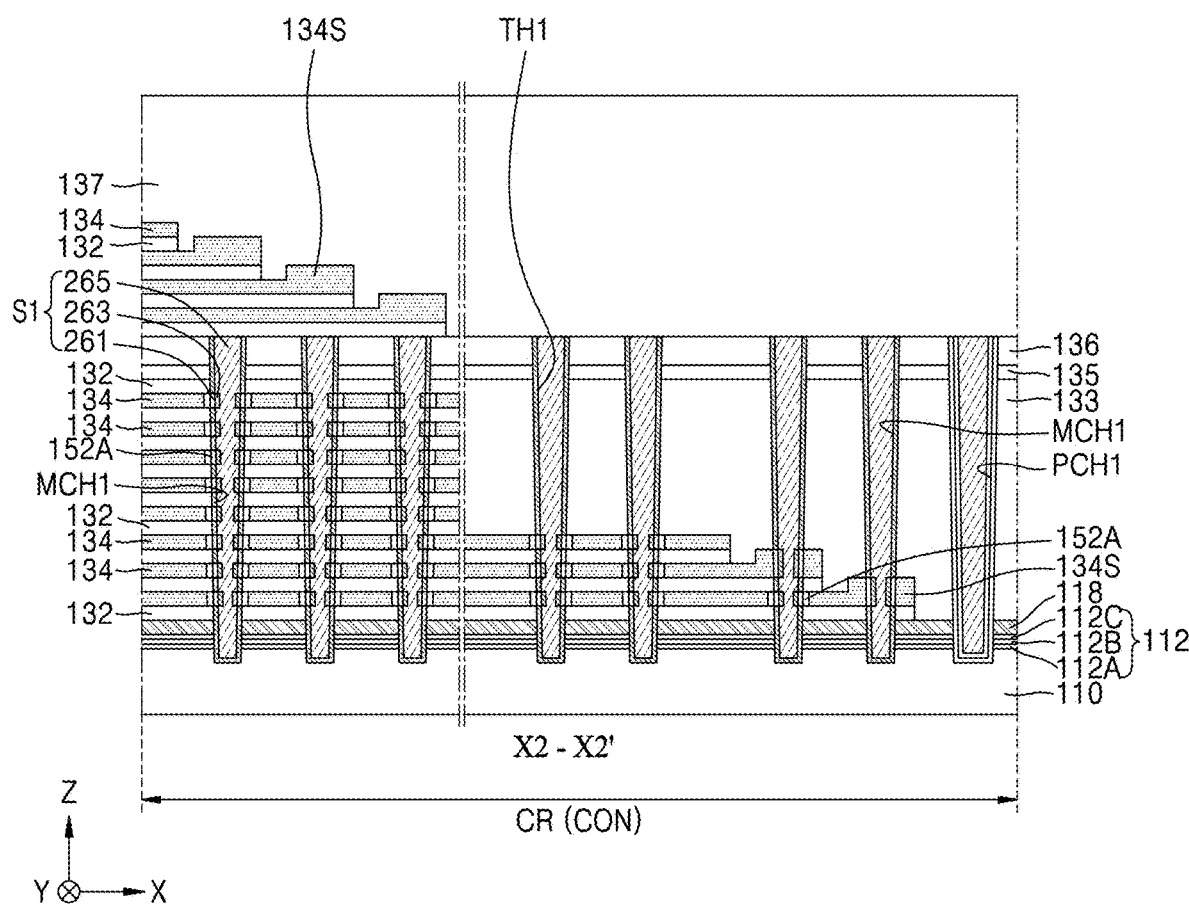

Referring to FIGS. 12A, 12B, and 12C, by performing similar processes to those described with referring to FIGS. 8A through 9B in the chip region CR, a structure including a plurality of insulating layers 132, the plurality of sacrificial insulating layers 134, and the plurality of sacrificial insulating layers 134S required to form the second stack STB (refer to FIGS. 5A through 5C) may be formed, and the intermediate insulating block 137 covering the structure in the connection region CON of the chip region CR may be formed. The intermediate insulating block 137 may include the same material as the lower insulating block 133.

The carbon layer 261 and the sacrificial metal layers 263 and 265 may be removed so that an entry-side space of each of the plurality of lower vertical holes is emptied by a process to be described below. A process of removing the carbon layer 261 and the sacrificial metal layers 263 and 265 may be performed by a strip process. The strip process may be performed by using sulfuric acid ($H_2SO_4$). Sulfuric acid may simultaneously remove not only the sacrificial metal layers 263 and 265 but the carbon layer 261.

Although not illustrated in the drawings, all of the sacrificial metal layers 263 and 265 and the carbon layer 261 in the plurality of vertical holes may not be removed by sulfuric acid. Some vertical holes may not have undergone the process, and thus carbon component may remain in some vertical holes even when the carbon layer 261 in other vertical holes is removed. In a post-process test of a semiconductor device, for example, a test using an optical critical dimension (OCD), by performing a destructive inspection and component analysis may be performed on some vertical holes, where the sacrificial metal layers 263 and 265 have not been removed, such as an alignment key region, it may be determined whether technical ideas of inventive concepts has been applied according to whether carbon has been detected.

The carbon layer 261 may include pure carbon atoms, but may include some hydrogen impurities. The carbon layer 261 may be formed to have a thickness of about 5 nm to about 15 nm. In an embodiment, the sacrificial metal layer 263 including titanium nitride may be a portion of the sacrificial metal layer 265, but is not limited thereto. In an embodiment, the sacrificial metal layer 265 may include W, but is not limited thereto.

The carbon layer 261 may, when removed in a subsequent process, be easily removed in the strip process using sulfuric acid. The reaction between silicon nitride (SiN) and titanium nitride (TiN), that may be generated in the substrate 110, may be limited and/or prevented by carbon constituting the carbon layer 261. In addition, because the carbon layer 261 is selectively deposited, the carbon layer 261 may not be deposited on an oxide surface of the substrate 110, for example, a silicon dioxide ($SiO_2$) region, or the like, and thus may limit and/or suppress side reactions caused by generation of SiOC, or the like.

As a control example, when the sacrificial metal layers 263 and 265 are deposited directly on the side walls of the lower vertical hole without depositing the carbon layer 261 thereto, metal silicide by-products may be unintentionally formed on surfaces of silicon-included layers (for example, the plurality of insulating layers 132 and/or the plurality of sacrificial insulating layers 134) constituting the internal sidewalls of the plurality of lower vertical holes (for example, the plurality of lower channel holes CH1, the plurality of lower dummy channel hole DCH1, and the plurality of lower word line cut holes WCH1), or metal residue such as titanium may remain in the lower vertical hole, and accordingly, performance of the semiconductor device 100 may be deteriorated. The metal residue as described above may cause defects such as a hole bridge phenomenon.

In addition, as another control example, when instead of the carbon layer 261, a double layer structure, including a silicon oxide liner in contact with the plurality of insulating layers 132 and the plurality of sacrificial insulating layers 134, which are exposed in the plurality of lower vertical holes, and a metal nitride layer of titanium nitride in contact with the silicon oxide liner, is formed, when the silicon oxide liner and the metal nitride layer are removed by using a wet etching process in a subsequent process, the plurality of insulating layers 132 exposed in the plurality of lower vertical holes may be damaged, and accordingly, an issue of surface defect such as a dimple in the plurality of insulating layers 132 may occur.

According to embodiments of inventive concepts, the plurality of lower sacrificial structures S1 and the plurality of intermediate sacrificial structures S2 may include a plurality of insulating layers 132 and a carbon layer 261 in contact with the plurality of sacrificial insulating layers 134, which are exposed in the plurality of lower vertical holes, and the carbon layer 261 may not include a metal. Thus, an issue of un-wanted metal silicide by-products formed in the plurality of lower vertical holes until the plurality of lower sacrificial structures S1 and the plurality of intermediate sacrificial structures S2 are removed in a subsequent process after the plurality of lower sacrificial structures S1 and a plurality of intermediate sacrificial structures S2 are formed, or an issue of a damage on the plurality of insulating layers 132 and the plurality of sacrificial insulating layers 134, which are exposed in the plurality of lower vertical holes, may be limited and/or prevented.

As illustrated in FIG. 11D, while the plurality of lower vertical holes are formed in the chip region CR illustrated in FIGS. 11A, 11B, and 11C, the recess region RR and the plurality of key holes KH may be formed in the insulating structure 220 in the scribe lane region SLR. The plurality of key holes KH may be arranged adjacent to the recess region RR. In addition, while the carbon layer 261 and the sacrificial metal layers 263 and 265 in the chip region CR are formed, the carbon layer 261 and the sacrificial metal layer 265 may be formed inside Each of the recess region RR and the plurality of key holes KH in the scribe lane region SLR.

The carbon layers 261 and 262 may be formed simultaneously. In the recess region RR of the scribe lane region SLR, the carbon layer 262 may be selectively deposited on portions where a silicon nitride layer is exposed in the internal sidewalls of the recess region RR. Inside Each of the plurality of key holes KH of the scribe lane region SLR, the carbon layer 262 may be selectively deposited on portions where the silicon nitride layer is exposed on the inner surface of each of the plurality of key holes KH.

While the carbon layer 261 and the sacrificial metal layers 263 and 265 are removed from the chip region CR so that the entrance-side space of each of the plurality of lower vertical holes is emptied, the carbon layer 262 and the sacrificial metal layers 264 and 266 may also be removed from the scribe lane region SLR. In this case, portions covering a bottom surface of the recess region RR, of the carbon layer 262 and the sacrificial metal layers 264 and 266, may be removed to expose the insulating structure 220 on the bottom surface of the recess region RR, and an entrance-side space of each of the plurality of key holes KH may be emptied.

Figure 13A:
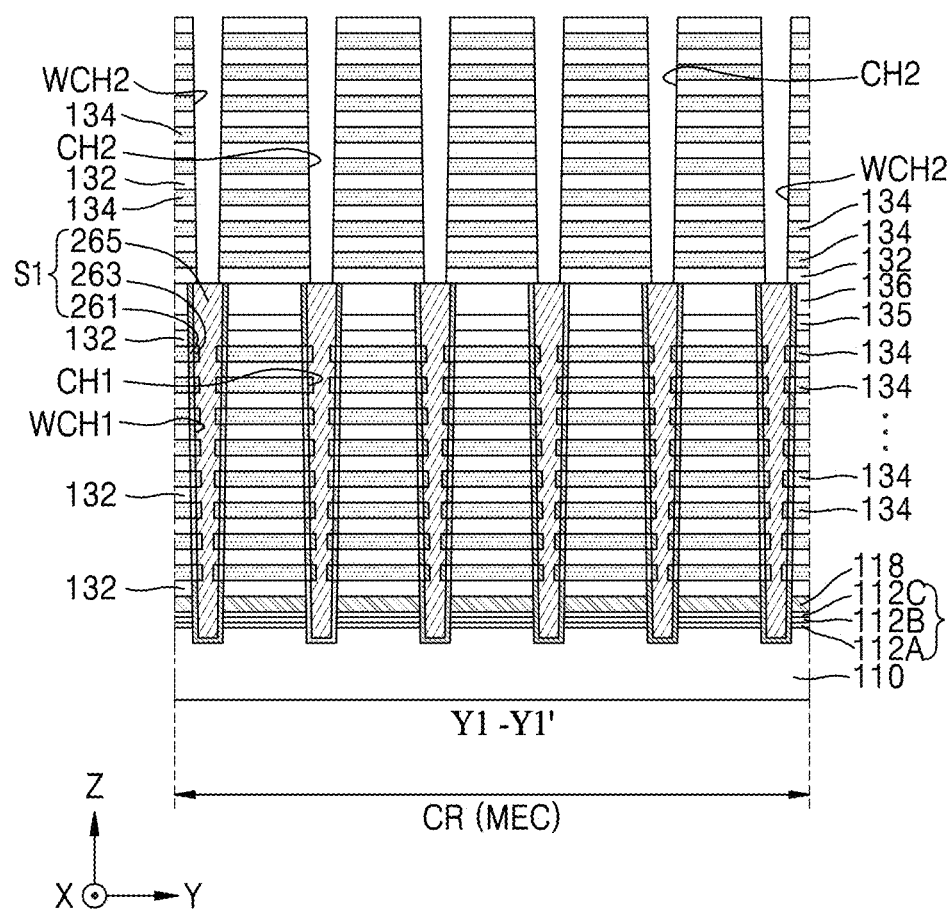
Figure 13B:
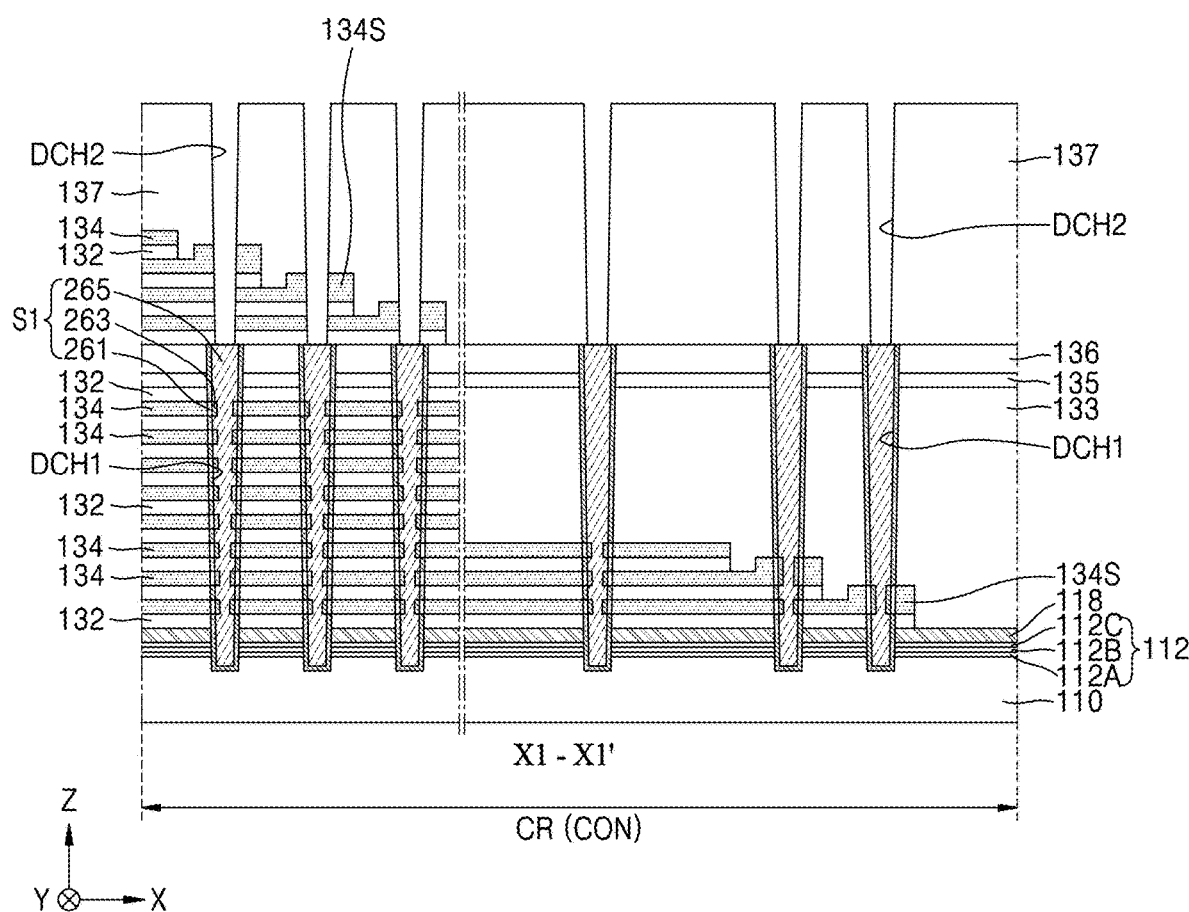
Figure 13C:
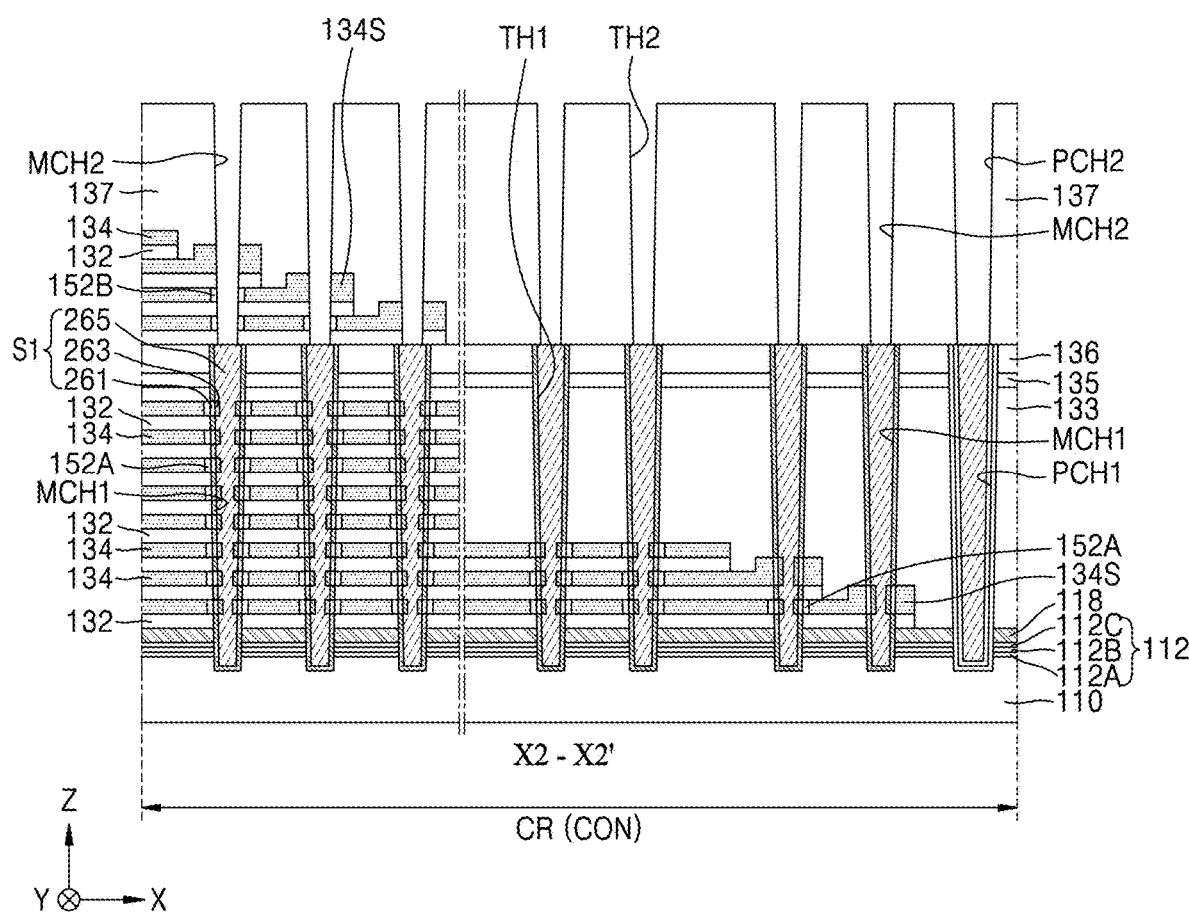

Referring to FIGS. 13A, 13B, and 13C, from the resultant product of FIGS. 12A, 12B, and 12C, by performing a dry etching process on a structure including the plurality of insulating layers 132, the plurality of sacrificial insulating layers 134, and the plurality of sacrificial insulating layers 134S, used for forming the second stack STB (refer to FIGS. 5A through 5C), and on the intermediate insulating block 137, in the memory cell region MEC and the connection region CON of the chip region CR, the plurality of intermediate vertical holes respectively connected to the plurality of lower vertical holes may be formed. The plurality of intermediate vertical holes may include a plurality of intermediate channel holes CH2 and a plurality of intermediate word line cut holes WCH2 arranged in the memory cell region MEC, a plurality of intermediate dummy channel holes DCH2, a plurality of intermediate memory cell contact holes MCH2, and a plurality of intermediate plate contact holes PCH2, and a plurality of intermediate through holes TH2 arranged in the connection region CON. Although not illustrated in FIGS. 13A, 13B, and 13C, the plurality of intermediate vertical holes may further include a plurality of intermediate holes required for forming the plurality of insulation support structures SP illustrated in FIG. 4. Sacrificial metal layers 263 and 265 of the plurality of lower sacrificial structures S1 may be respectively exposed via the plurality of intermediate vertical holes.

Figure 14A:
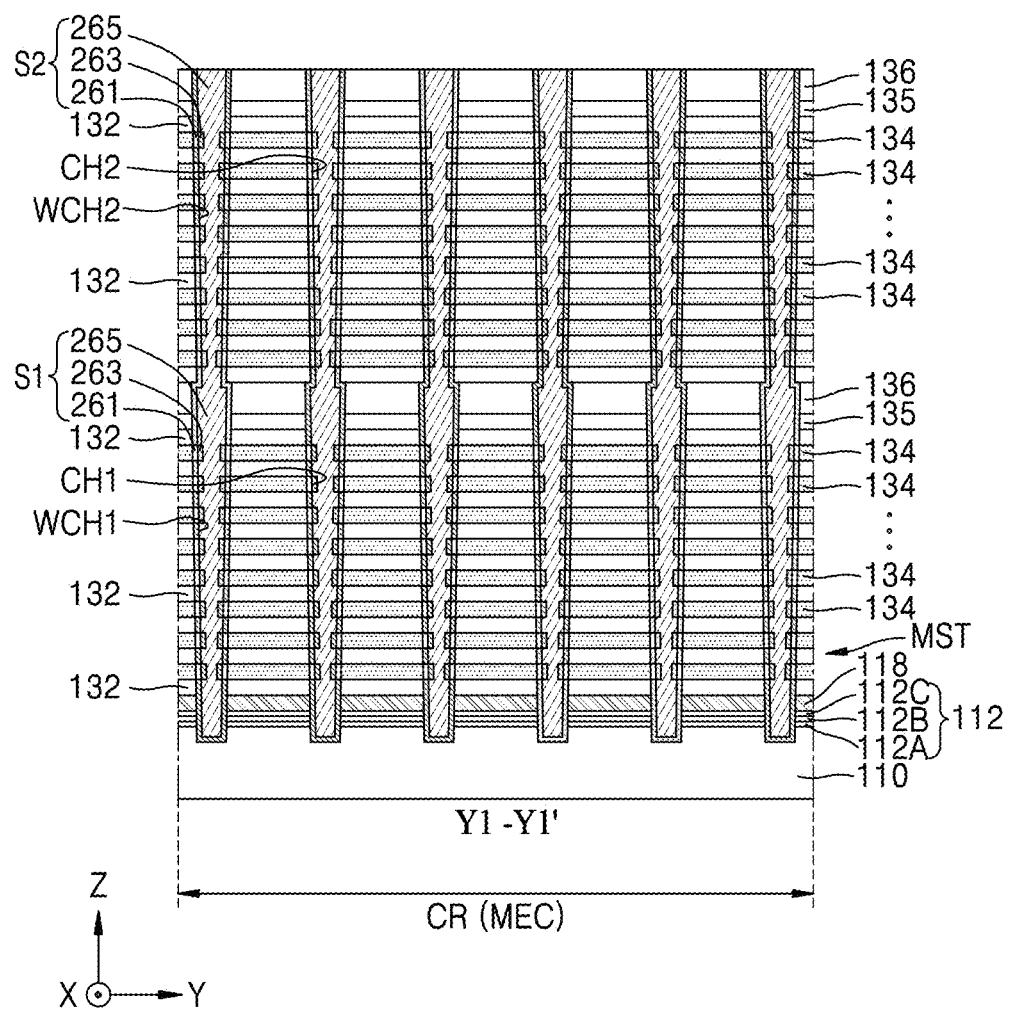
Figure 14B:
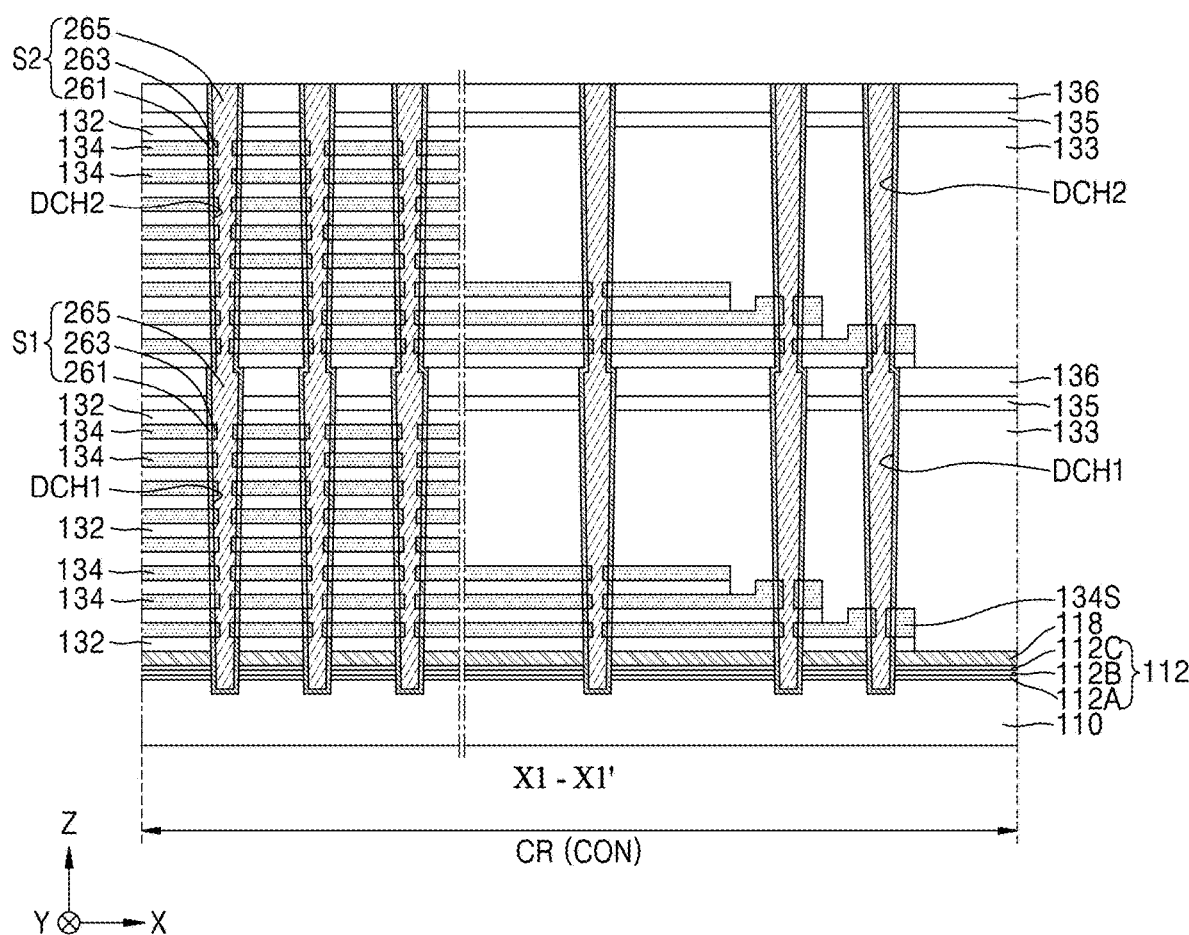
Figure 14C:
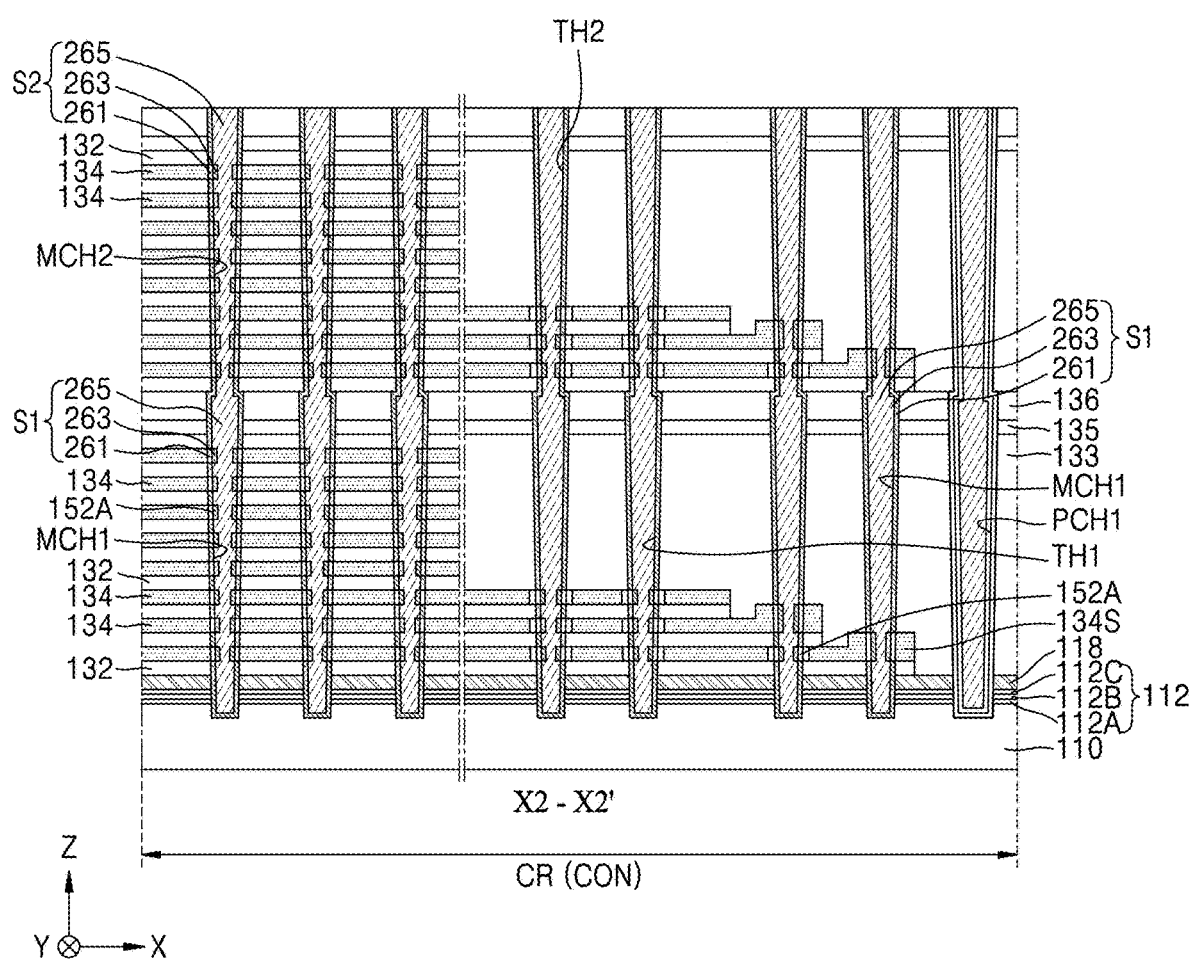

Referring to FIGS. 14A, 14B, and 14C, the plurality of intermediate sacrificial structures S2 respectively filling the plurality of intermediate vertical holes may be formed in the resultant product of FIGS. 13A, 13B, and 13C. The process of forming the plurality of intermediate sacrificial structures S2 may be the same as the method of forming and constituent materials of the lower sacrificial structure S1 described with respect to FIGS. 9A, 9B, 10A, 10B, and 10C, and thus, duplicate descriptions thereof are omitted. The intermediate sacrificial structure S2 formed in the above manner may be referred to as the second stack STB. Thereafter, the third stack STC may be formed on the second stack STB (refer to FIGS. 13A, 13B, and 13C). The third stack STC may correspond to the same structure as the lower sacrificial structure S1 and the intermediate sacrificial structure S2. The third stack STC may include $SiO_2$.

The plurality of intermediate sacrificial structures S2 may be emptied by a process to be described below, and the plurality of intermediate vertical holes may remain. By using a strip process using sulfuric acid to remove the plurality of intermediate sacrificial structures S2, the sacrificial metal layers 263 and 265 and the carbon layer 262 may be removed via the plurality of intermediate vertical holes.

Figure 15A:
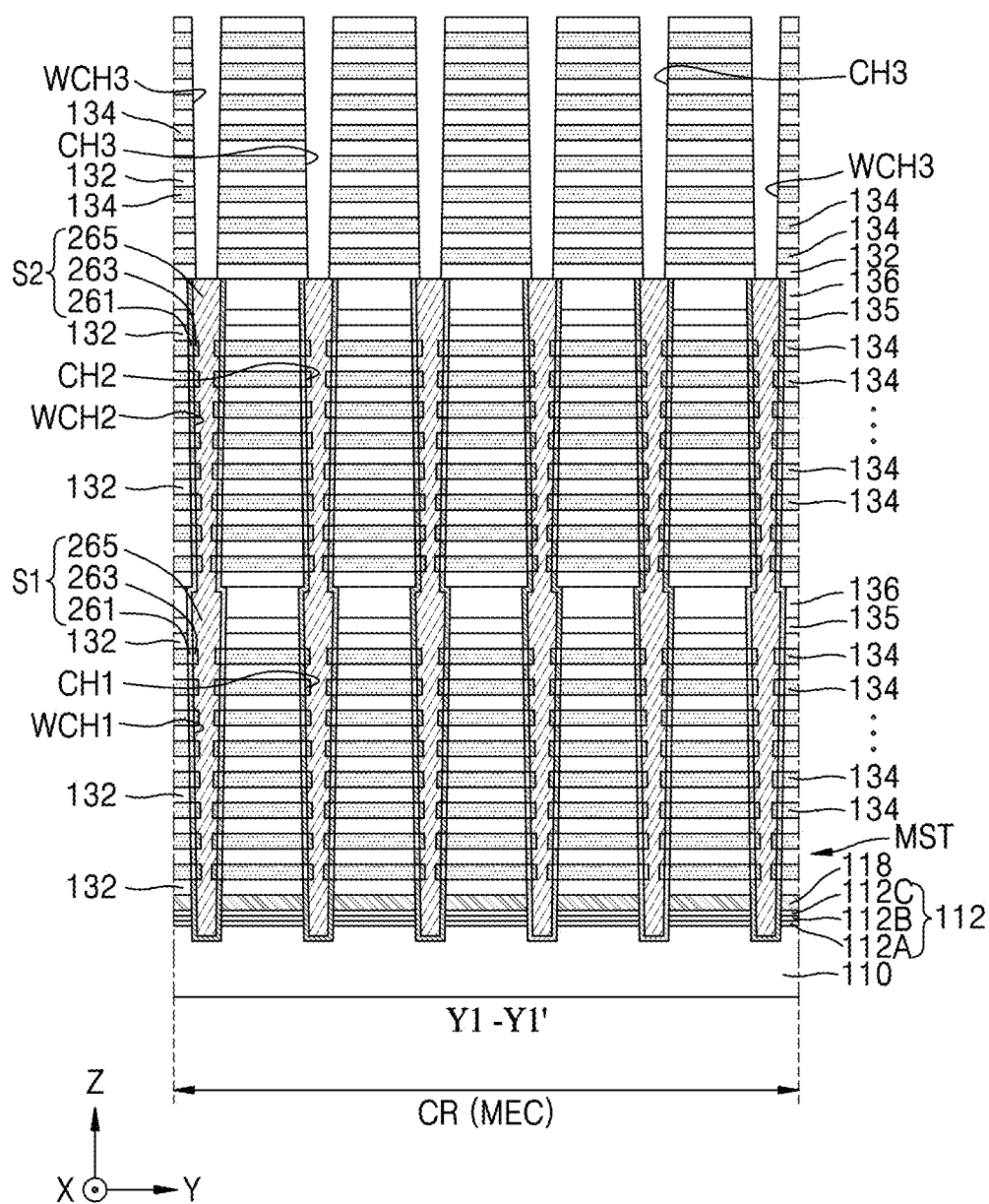
Figure 15B:
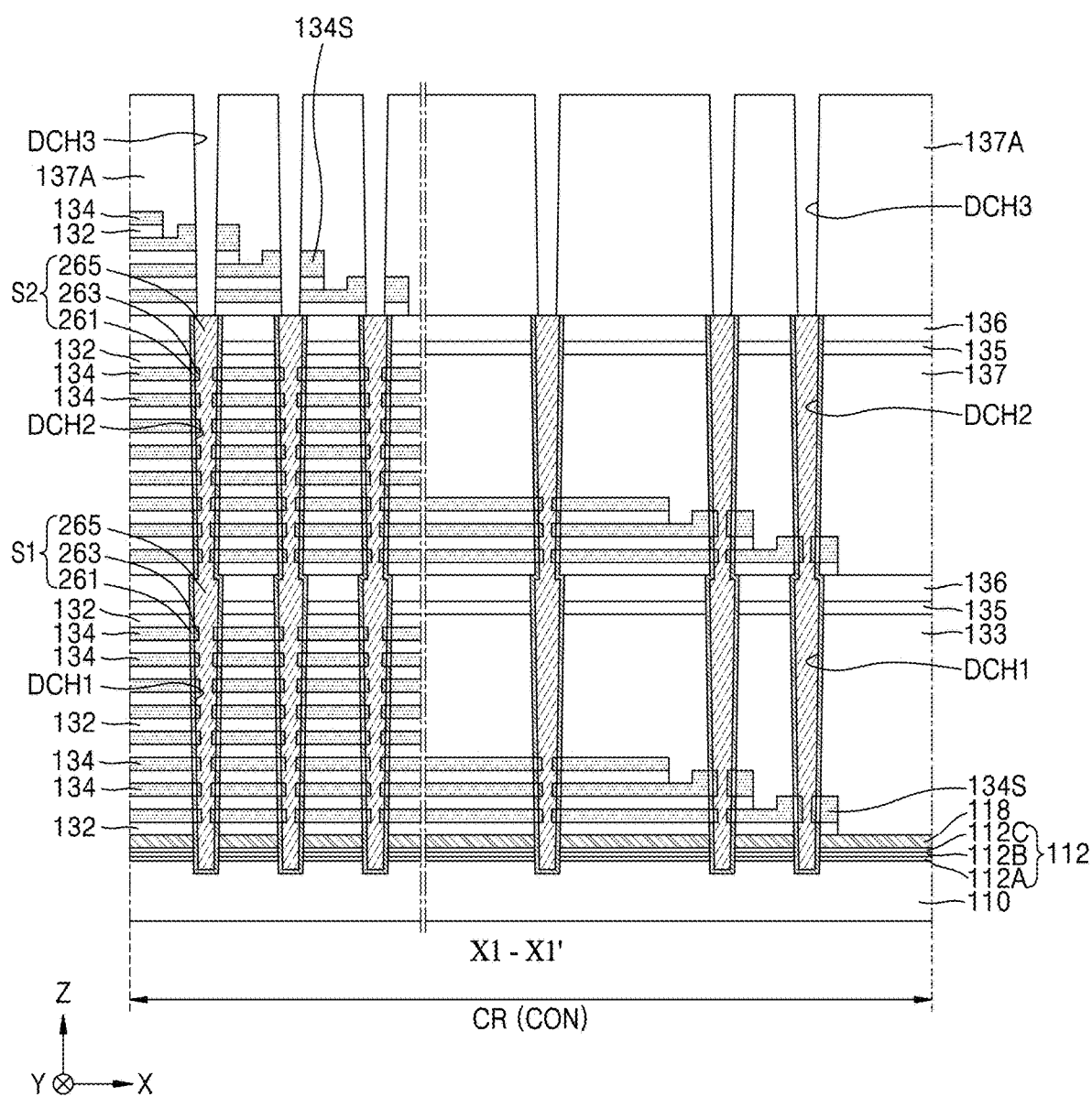
Figure 15C:
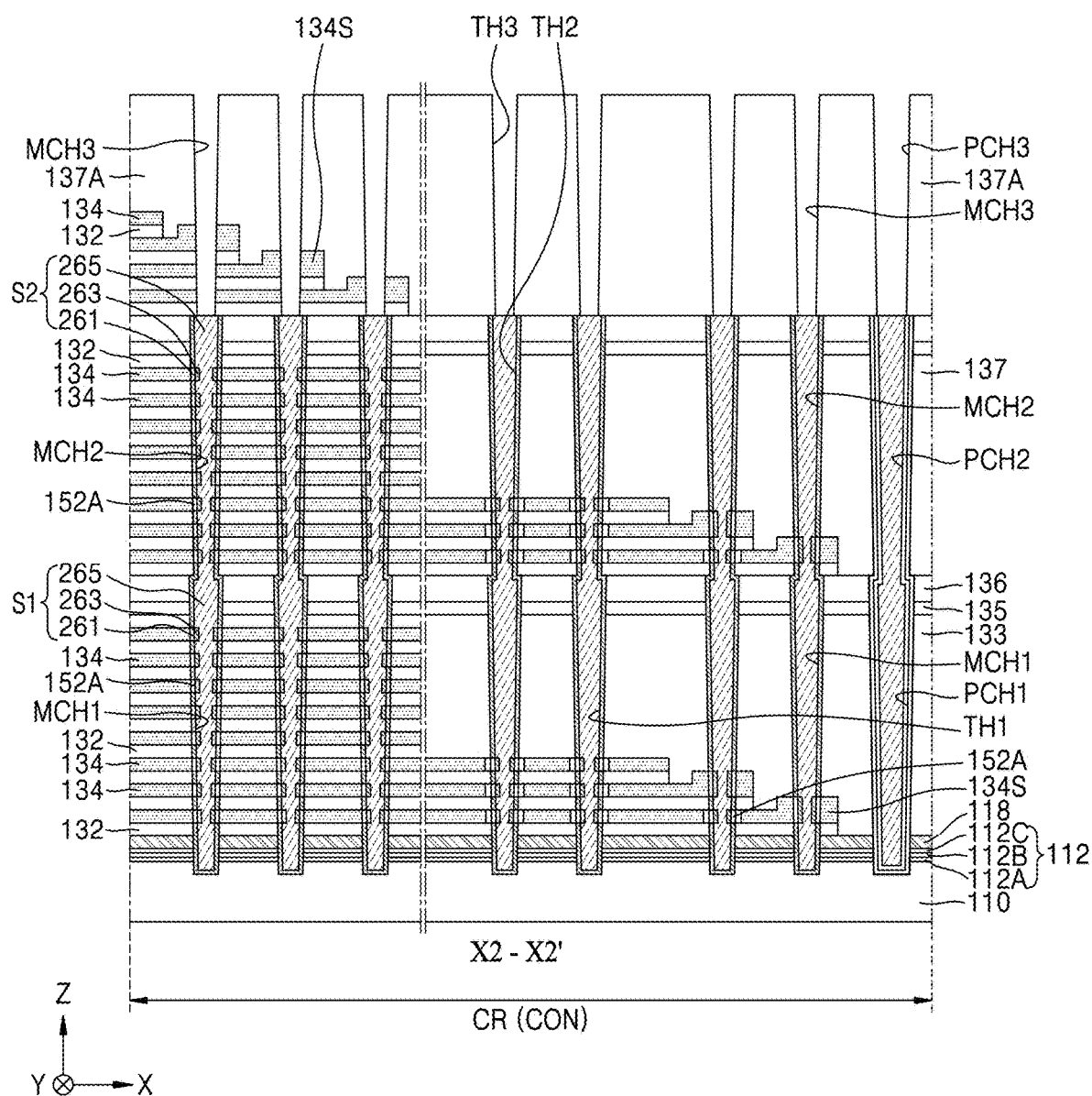

Referring to FIGS. 15A, 15B, and 15C, from the resultant product of FIGS. 14A, 14B, and 14C, by performing a dry etching process on the plurality of insulating layers 132, the plurality of sacrificial insulating layers 134, and the upper insulating block 137A required for forming the third stack STC (refer to FIGS. 5A through 5C) in the memory cell region MEC and the connection region CON of the chip region CR, the plurality of upper vertical holes respectively connected to the plurality of intermediate vertical holes may be formed. The plurality of upper vertical holes may include a plurality of upper channel holes CH3 and a plurality of upper word line cut holes WCH3 arranged in the memory cell region MEC, a plurality of upper dummy channel holes DCH3, a plurality of intermediate memory cell contact holes MCH3, an upper plate contact holes PCH3, and a plurality of upper plate contact holes TH3 arranged in the connection region CON. Although not illustrated in FIGS. 15A, 15B, and 15C, the plurality of upper vertical holes may further include a plurality of holes required for forming the plurality of insulation support structures SP illustrated in FIG. 4. The sacrificial metal layers 263 and 265 of the plurality of intermediate sacrificial structures S2 may be respectively exposed via the plurality of upper vertical holes. In addition, although not illustrated in the drawings, the third stack STC may include a stack of a shape, in which the plurality of insulating layers 132 and the plurality of sacrificial insulating layers 134 are alternately stacked, and in addition, may also include a stack including only insulating materials such as SiO$_2$.

Thereafter, a plurality of plug structures may be formed in the plurality of lower vertical holes, the plurality of intermediate vertical holes, and the plurality of upper vertical holes in the memory cell region MEC and the connection region CON of the chip region CR. The plurality of plug structures may include the plurality of channel structures 140, the plurality of word line cut structures WLC, the plurality of dummy channel structures 140D, the plurality of memory cell contacts MC, the plurality of through electrodes THV, the plurality of insulation support structures SP, and the conductive plate contact 164. The plug structure including the conductive plate contact 164 may further include an insulating spacer 162 surrounding the conductive plate contact 164. Thereafter, the first upper insulating layer UL1 covering the plurality of plug structures may be formed in the memory cell region MEC and the connection region CON of the chip region CR.

A forming sequence of each of the plurality of channel structures 140, the plurality of word line cut structures WLC, the plurality of dummy channel structures 140D, the plurality of memory cell contacts MC, the plurality of through electrodes THV, the plurality of insulation support structures SP, and the conductive plate contact 164, which are included in the plurality of plug structures, may be variously selected.

However, after the plurality of channel structures 140 and the plurality of dummy structures 140D are formed, and before the plurality of word line cut structures WLC are formed, the plurality of lower sacrificial structures S1 and the plurality of intermediate sacrificial structures S2 respectively filling the plurality of lower word line cut holes WCH1 and the plurality of intermediate word line cut holes WCH2 may be removed, the insulating plate 112 may be selectively removed by using the plurality of lower word line cut holes WCH1 and the plurality of intermediate word line cut holes WCH2 only in the memory cell region MEC and the connection region CON of the chip region CR, and then, an empty space formed as a result thereof may be filled with the first conductive plate 114. While the insulating plate 112 is removed from the memory cell region MEC, in the memory cell region MEC, portions of a gate dielectric layer 182 included in a channel structure 180 and adjacent to the insulating plate 112 may be removed together with the insulating plate 112, and as a result, the first conductive plate 114 may penetrate some portion of the gate dielectric layer 182 in the horizontal direction (X direction and/or Y direction) and be in contact with a channel region 184.

In addition, after the first conductive plate 114 is formed, and before the plurality of word line cut structures WLC are formed, the sacrificial insulating layer 134 and the sacrificial pad unit 134S may be replaced with the plurality of gate lines 130 and the plurality of conductive pad units 130A in the memory cell region MEC and the connection region CON via the plurality of lower word line cut holes WCH1 and the plurality of upper word line cut holes WCH2. After the first conductive plate 114 and the plurality of gate lines 130 are formed, the plurality of word line cut structures WLC filling the plurality of lower word line cut holes WCH1 and the plurality of intermediate word line cut holes WCH2 may be formed.

Thereafter, Referring to FIGS. 7A, 7B, and 7C, on the resultant product, by forming the second upper insulating layer UL2 sequentially covering the first upper insulating layer UL1 and the plurality of drain regions 148, forming the plurality of contact plugs 172 penetrating the first upper insulating layer UL1 and the second upper insulating layer UL2 in the connection region CON, forming the plurality of upper wiring layers UML on the second upper insulating layer UL2 and the plurality of contact plugs 172 in the connection region CON, forming the plurality of contact plugs 176 penetrating the second upper insulating layer UL2 and connected to the drain region 148 in the memory cell region MEC, forming the plurality of bit lines BL connected to the plurality of contact plugs 176 on the second upper insulating layer UL2, and forming the third upper insulating layer UL3 filling spaces between the plurality of upper wiring layers UML and the plurality of bit lines BL, the semiconductor device 100 illustrated in FIGS. 1 through 6 may be manufactured.

So far, the method of manufacturing the semiconductor device 100 illustrated in FIGS. 1 through 6 has been described with reference to FIGS. 8A through 15C, it will be well understood by one of ordinary skill in the art that various structures, to which various modifications and changes are applied, may be manufactured within the scope of technical ideas of inventive concepts.

Figure 16:
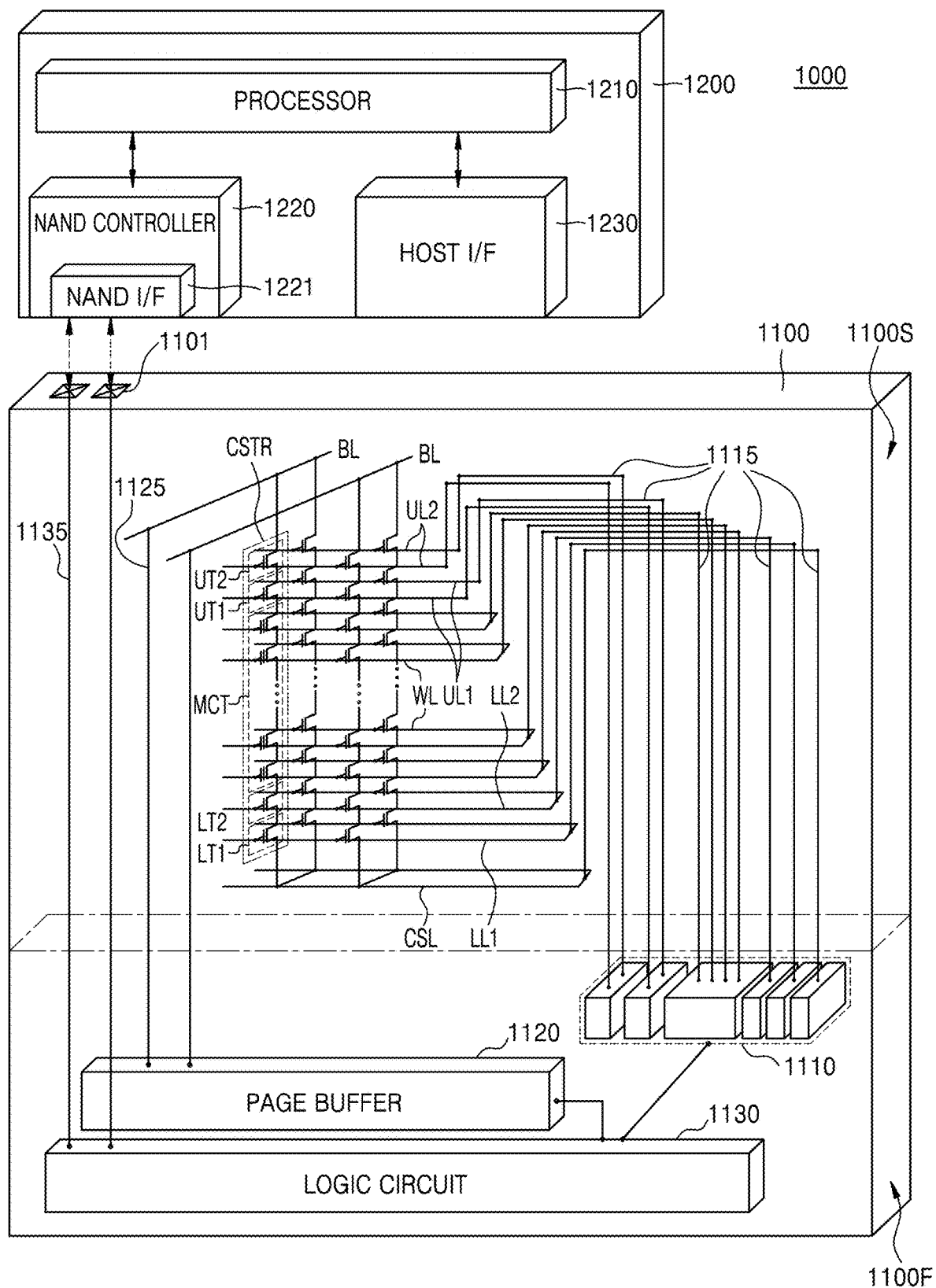
FIG. 16 is a diagram of an electronic system including a semiconductor device, according to an embodiment.

FIG. 16 is a diagram of an electronic system 1000 including the semiconductor device 1100, according to an embodiment.

Referring to FIG. 16, the electronic system 1000 according to an embodiment may include the semiconductor device 1100 and a controller 1200 electrically connected to the semiconductor device 1100. The electronic system 1000 may include a storage device including one or more semiconductor devices 1100, or an electronic device including the storage device. For example, the electronic system 1000 may include a solid state drive device (SSD) including at least one semiconductor device 1100, a universal serial bus (USB), a computing system, a medical device, or a communication device.

The semiconductor device 1100 may include a non-volatile memory device. For example, the semiconductor device 1100 may include a NAND flash memory device including at least one of the structures described above with respect to the semiconductor devices 100 and 200 described with reference to FIGS. 1 through 7. The semiconductor device 1100 may include a first structure 1100F and a second structure 1100S on the first structure 1100F. In some embodiments, the first structure 1100F may be arranged next to the second structure 1100S. The first structure 1100F may include a periphery circuit structure including a decoder circuit 1110, a page buffer 1120, and a logic circuit 1130. The second structure 1100S may include a memory cell structure including the bit line BL, a common source line CSL, the plurality of word lines WL, a first gate upper line UL1 and a second gate upper line UL2, and a plurality of memory cell strings CSTR between the bit line BL and the common source line CSL.

In the second structure 1100S, each of the plurality of memory cell strings CSTR may include lower transistors LT1 and LT2 adjacent to the common source line CSL, and upper transistors UT1 and UT2 adjacent to the bit line BL, and a plurality of memory cell transistors MCT between the lower transistors LT1 and LT2 and the upper transistors UT1 and UT2. The number of lower transistors LT1 and LT2 and the number of upper transistors UT1 and UT2 may be variously modified according to embodiments.

In some embodiments, the upper transistors UT1 and UT2 may include the string select transistor SST, and the lower transistors LT1 and LT2 may include the ground select transistor GST. Each of a plurality of lower gate lines LL1 and LL2 may include gate electrodes of the lower transistors LT1 and LT2. The word line WL may include a gate electrode of the memory cell transistor MCT, and the first upper gate line UL1 and the second upper gate line UL2 may respectively include gate electrodes of the upper transistors UT1 and UT2.

The common source line CSL, the plurality of lower gate lines LL1 and LL2, the plurality of word lines WL, and the first and second upper gate lines UL1 and UL2 may be electrically connected to the decoder circuit 1110 via a plurality of first connection wirings 1115 extending to the second structure 1100S in the first structure 1100F. The plurality of bit lines BL may be electrically connected to the page buffer 1120 via a plurality of second connection wirings 1125 extending to the second structure 1100S in the first structure 1100F.

In the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The semiconductor device 1100 may communicate with the controller 1200 via an input/output pad 1101 electrically connected to the logic circuit 1130. The input/output pad 1101 may be electrically connected to the logic circuit 1130 via an input/output connection wiring 1135 extending to the second structure 1100S in the first structure 1100F.

The controller 1200 may include a processor 1210, a NAND controller 1220, and a host interface (I/F) 1230. According to embodiments, the electronic system 1000 may include a plurality of semiconductor devices 1100, and in this case, the controller 1200 may control the plurality of semiconductor devices 1100.

The processor 1210 may control the overall operation of the electronic system 1000 including the controller 1200. The processor 1210 may operate according to a certain firmware, and may access the semiconductor device 1100 by controlling the NAND controller 1220. The NAND controller 1220 may include a NAND I/F 1221 processing communication with the semiconductor device 1100. Via the NAND I/F 1221, a control command for controlling the semiconductor device 1100, data to be written in the plurality of memory cell transistors MCT of the semiconductor device 1100, data to be read from the plurality of memory cell transistors MCT of the semiconductor device 1100, or the like may be transmitted. The host I/F 1230 may provide a communication function between the electronic system 1000 and an external host. When a control command is received from the external host via the host I/F 1230, the processor 1210 may control the semiconductor device 1100 in response to the control command.

Figure 17:
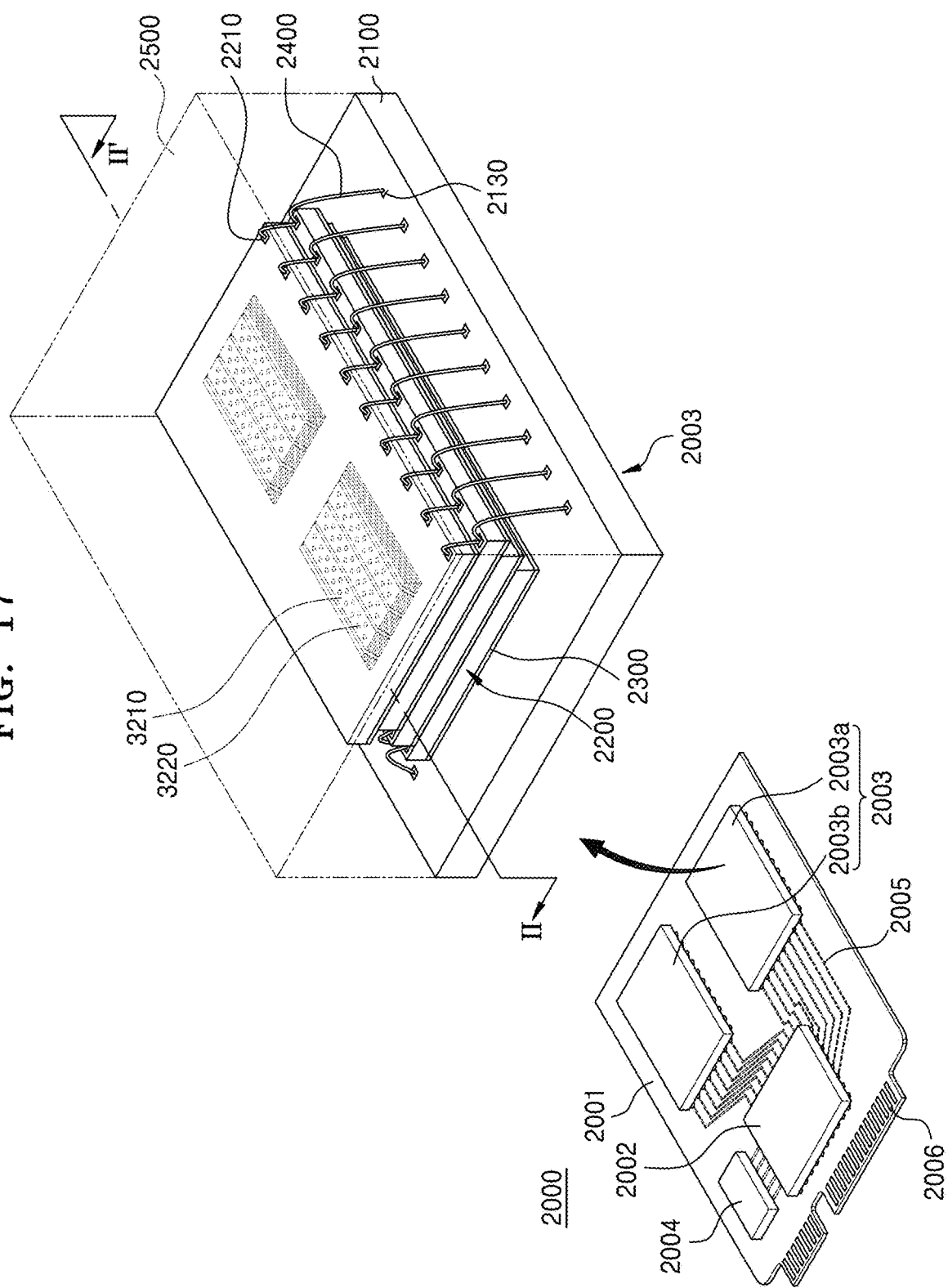
FIG. 17 is a schematic perspective view of an electronic system including a semiconductor device, according to an embodiment.

FIG. 17 is a schematic perspective view of an electronic system 2000 including a semiconductor device, according to an embodiment.

Referring to FIG. 17, the electronic system 2000 according to an embodiment may include a main substrate 2001, a controller 2002 mounted on the main substrate 2001, one or more semiconductor packages 2003, and DRAM 2004. The semiconductor package 2003 and the DRAM 2004 may be interconnected to the controller 2002 via a plurality of wiring patterns 2005 formed on the main substrate 2001.

The main substrate 2001 may include a connector 2006 including a plurality of pins combined with the external host. The number and arrangement of the plurality of pins in the connector 2006 may vary according to a communication interface between the electronic system 2000 and the external host. In some embodiments, the electronic system 2000 may communicate with the external host according to any one of interfaces among universal serial bus (USB), peripheral component interconnect (PCI) express (PCI-E), serial advanced technology attachment (SATA), M-Phy for a universal flash storage (UFS), etc. In some embodiments, the electronic system 2000 may operate by power supplied by the external host via the connector 2006. The electronic system 2000 may also further include a power management integrated circuit (PMIC) which distributes power supplied from the external host to the controller 2002 and the semiconductor package 2003.

The controller 2002 may write data to the semiconductor package 2003, or read data from the semiconductor package 2003, and may improve an operation speed of the electronic system 2000.

The DRAM 2004 may include a buffer memory for reducing a speed difference between the semiconductor package 2003, or a data storage space, and the external host. The DRAM 2004 included in the electronic system 2000 may also operate as a kind of a cache memory, and may also provide a space for temporarily storing data in a control operation on the semiconductor package 2003. When the DRAM 2004 is included in the electronic system 2000, the controller 2002 may further include a DRAM controller for controlling the DRAM 2004 in addition to the NAND controller 1220 for controlling the semiconductor package 2003.

The semiconductor package 2003 may include a first semiconductor package 2003a and a second semiconductor package 2003b, which are apart from each other. Each of the first and second semiconductor packages 2003a and 2003b may include a semiconductor package including a plurality of semiconductor chips 2200. Each of the first and second semiconductor packages 2003a and 2003b may include a package substrate 2100, the plurality of semiconductor chips 2200 on the package substrate 2100, an adhesive layer 2300 on a lower surface of each of the plurality of semiconductor chips 2200, a connection structure 2400 electrically connecting the plurality of semiconductor chips 2200 to the package substrate 2100, and a molding layer 2500 covering the plurality of semiconductor chips 2200 and the connection structure 2400 on the package substrate 2100.

The package substrate 2100 may include a printed circuit board including a plurality of package upper pads 2130. Each of the plurality of semiconductor chips 2200 may include an input/output pad 2210. The input/output pad 2210 may correspond to the I/O pad 1101 in FIG. 18. Each of the plurality of semiconductor chips 2200 may include a plurality of gate stacks 3210 and a plurality of channel structures 3220. Each of the plurality of semiconductor chips 2200 may include at least one among the semiconductor devices 100 and 200 described with reference to FIGS. 1 through 7.

In some embodiments, the connection structure 2400 may include a bonding wire electrically connecting the input/output pad 2210 to the package upper pad 2130. Accordingly, in the first and second semiconductor packages 2003a and 2003b, the plurality of semiconductor chips 2200 may be electrically connected to each other by using a bonding wire method, and may be electrically connected to the package upper pad 2130 of the package substrate 2100. According to some embodiments, in the first and second semiconductor packages 2003a and 2003b, the plurality of semiconductor chips 2200 may also be electrically connected to each other by using a connection structure including a through silicon via TSV, instead of the connection structure 2400 of the bonding wire method.

In some embodiments, the controller 2002 and the plurality of semiconductor chips 2200 may also be included in one package. In some embodiments, the controller 2002 and the plurality of semiconductor chips 2200 may be mounted on a separate interposer substrate different from the main substrate 2001, and the controller 2002 and the plurality of semiconductor chips 2200 may also be connected to each other by using a wiring formed on the interposer substrate.

Figure 18:
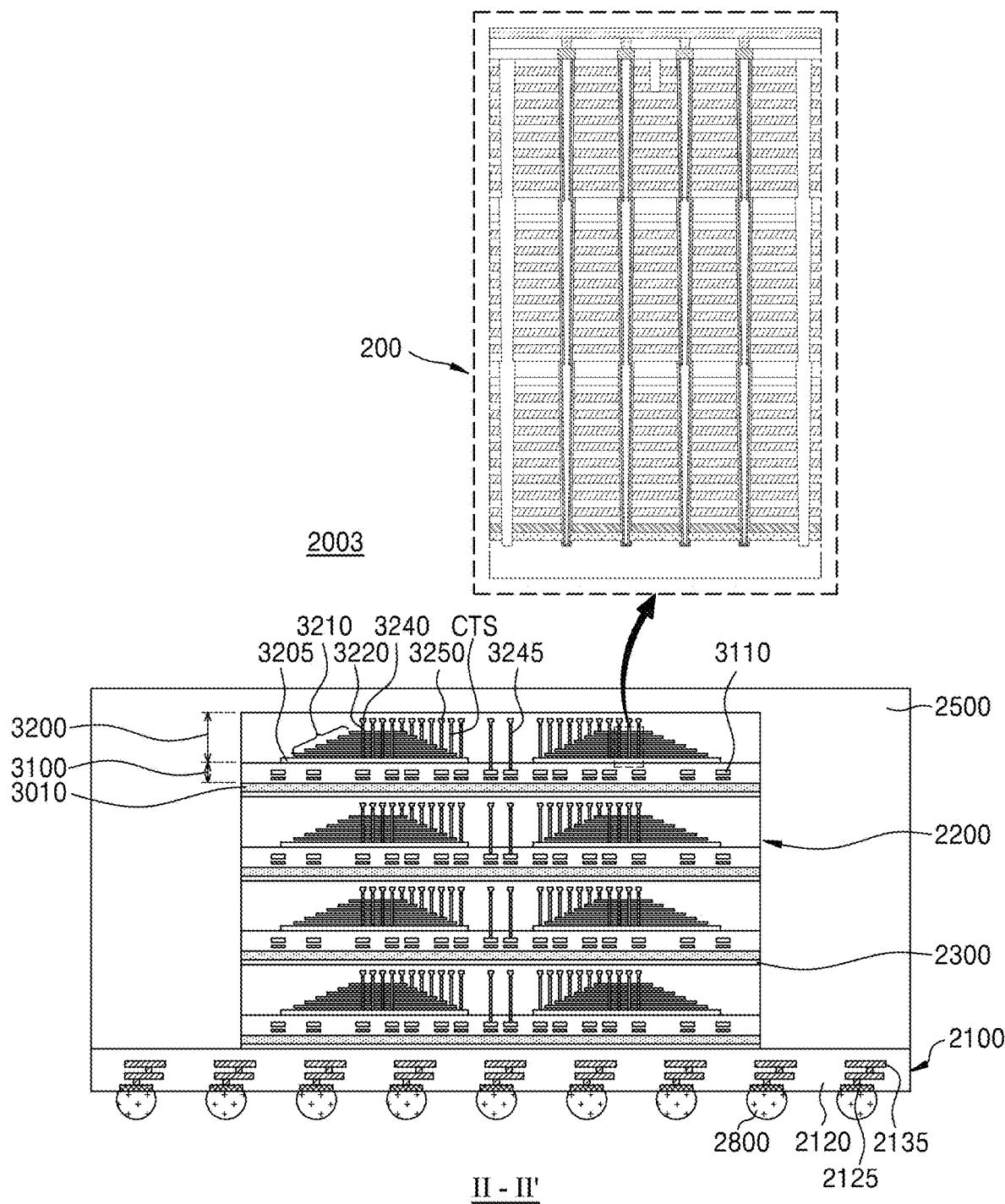
FIG. 18 is a detailed illustrative diagram of components on a cross-section taken along line II-II' in FIG. 17, and is a schematic cross-sectional view of a semiconductor package, according to an embodiment.

FIG. 18 is a schematic cross-sectional view of a semiconductor package 2003, according to an embodiment. In FIG. 18, the configuration in the cross-section view taken along line II-II' in FIG. 17 is illustrated in more detail.

Referring to FIG. 18, in the semiconductor package 2003, the package substrate 2100 may include a printed circuit board. The package substrate 2100 may include a package substrate body unit 2120, the plurality of package upper pads 2130 (refer to FIG. 17) arranged on the package substrate body unit 2120, a plurality of lower pads 2125 arranged under the package substrate body unit 2120 or exposed to the lower surface of the package substrate body unit 2120, and a plurality of internal wirings 2135 respectively and electrically connecting the plurality of package upper pads 2130 to the plurality of lower pads 2125 in the package substrate body unit 2120. The plurality of package upper pads 2130 may be electrically connected to the plurality of connection structures 2400, respectively. The plurality of lower pads 2125 may be connected to the plurality of wiring patterns 2005 on the main substrate 2001 of the electronic system 2000 illustrated in FIG. 18 via a plurality of conductive connection units 2800.

Each of the plurality of semiconductor chips 2200 may include a semiconductor substrate 3010, and a first structure 3100 and a second structure 3200, which are sequentially stacked on the semiconductor substrate 3010. The first structure 3100 may include a periphery circuit region including a plurality of periphery wirings 3110. The second structure 3200 may include a common source line 3205, a gate stack 3210 on the common source line 3205, a channel structure 3220 penetrating the gate stack 3210, a bit line 3240 electrically connected to the channel structure 3220. In some embodiments, each of the plurality of semiconductor chips 2200 may include the same configuration as described with respect to the semiconductor devices 100 and 200 described with reference to FIGS. 1 through 7.

Each of the plurality of semiconductor chips 2200 may include a through wiring 3245 which is electrically connected to the plurality of periphery wirings 3110 of the first structure 3100 and extends into the second structure 3200. The through wiring 3245 may be arranged outside the gate stack 3210. In other embodiments, the semiconductor package 2003 may further include a through wiring penetrating the gate stack 3210. Each of the plurality of semiconductor chips 2200 may further include the input/output pad (2210 in FIG. 16) electrically connected to the plurality of periphery wirings 3110 of the first structure 3100.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been particularly shown and described with reference to embodiments thereof, it will be understood that various changes in form and details may be made therein without departing from the spirit and scope of the following claims.

What is claimed is:

1. A method of manufacturing a semiconductor device, the method comprising:
    forming a first stack by alternately stacking a plurality of first layers and a plurality of second layers one layer at a time on a substrate;
    forming a first vertical hole penetrating the first stack in a vertical direction;
    depositing a first carbon layer on internal sidewalls of the first vertical hole, the first carbon layer being in contact with portions exposed via the first vertical hole among the plurality of first layers and the plurality of second layers;
    forming a first sacrificial metal layer filling the first vertical hole on the first carbon layer;
    forming a second stack on the first stack, the second stack including a plural amount of first layers and a plural amount of second layers alternately stacked one layer at a time therein;
    forming a second vertical hole penetrating the second stack in the vertical direction, the second vertical hole in fluid communication with the first vertical hole;
    depositing a second carbon layer on internal sidewalls of the second vertical hole, the second carbon layer being in contact with portions exposed via the second vertical hole among the plural amount of first layers and the plural amount of second layers;
    forming a second sacrificial metal layer filling the second vertical hole on the second carbon layer;
    forming a third stack on the second stack;
    forming a third vertical hole penetrating the third stack in the vertical direction, the third vertical hole in fluid communication with the second vertical hole; and
    removing the first sacrificial metal layer, the second sacrificial metal layer, the first carbon layer, and the second carbon layer.

2. The method of claim 1, wherein
    the first carbon layer and the second carbon layer are selectively deposited on the plurality of second layers in the first stack and the plural amount of second layers in the second stack, and
    the first carbon layer and the second carbon layer are not deposited on the plurality of first layers in the first stack and the plural amount of first layers in the second stack.

3. The method of claim 1, wherein the first carbon layer and the second carbon layer each have a thickness of about 5 nm to about 15 nm.

4. The method of claim 1, wherein the depositing the first carbon layer and the second carbon layer is performed using an acetylene ($C_2H_2$) gas at a temperature of 500° C. or higher.

5. The method of claim 1, wherein the first sacrificial metal layer and the second sacrificial metal layer comprise titanium nitride (TiN) and tungsten (W).

6. The method of claim 1, wherein the removing the first sacrificial metal layer, the second sacrificial metal layer, the first carbon layer, and the second carbon layer includes a strip process using sulfuric acid ($H_2SO_4$).

7. The method of claim 1, wherein
    each of the plurality of first layers and the plural amount of first layers comprise a silicon oxide layer, and each of the plurality of second layers and the plural amount of second layers comprise a silicon nitride layer.

8. The method of claim 1, wherein the third stack comprises silicon dioxide ($SiO_2$).

9. The method of claim 1, further comprising:
removing the plurality of second layers and removing the plural amount of second layers to provide a removed space, and
filling the removed space with word lines.

10. The method of claim 1, further comprising:
forming a channel hole in each of the first vertical hole, the second vertical hole, and the third vertical hole.

11. A method of manufacturing a semiconductor device, the method comprising:
forming a first stack by alternately stacking a plurality of first layers and a plurality of second layers one layer at a time on a substrate;
forming a first vertical hole penetrating the first stack in a vertical direction;
depositing a first carbon layer on internal sidewalls of the first vertical hole, the first carbon layer being in contact with portions exposed via the first vertical hole among the plurality of first layers and the plurality of second layers;
forming a first sacrificial metal layer filling the first vertical hole on the first carbon layer;
forming a second stack on the first stack, the second stack including a plural amount of first layers and a plural amount of second layers alternately stacked one layer at a time therein;
forming a second vertical hole penetrating the second stack in the vertical direction, the second vertical hole in fluid communication with the first vertical hole;
depositing a second carbon layer on internal sidewalls of the second vertical hole, the second carbon layer being in contact with portions exposed via the second vertical hole among the plural amount of first layers and the plural amount of second layers;
forming a second sacrificial metal layer filling the second vertical hole on the second carbon layer;
forming a third stack on the second stack, the third stack including a plural number of first layers and a plural number of second layers alternately stacked on the second stack;
forming a third vertical hole penetrating the third stack in the vertical direction, the third vertical hole in fluid communication with the second vertical hole; and
removing the first sacrificial metal layer, the second sacrificial metal layer, the first carbon layer, and the second carbon layer.

12. The method of claim 11, wherein
the first carbon layer and the second carbon layer are selectively deposited on the plurality of second layers in the first stack and the plural amount of second layers in the second stack, respectively, and
the first carbon layer and the second carbon layer are not deposited on the plurality of first layers in the first stack and the plural amount of first layers in the second stack, respectively.

13. The method of claim 11, wherein the first carbon layer and the second carbon layer each have a thickness of about 5 nm to about 15 nm.

14. The method of claim 11, the depositing of the first carbon layer and the second carbon layer is performed using an acetylene ($C_2H_2$) gas at a temperature of 500° C. or higher.

15. The method of claim 11, wherein the first sacrificial metal layer and the second sacrificial metal layer each comprise titanium nitride (TiN) and tungsten (W).

16. The method of claim 11, wherein the removing the first sacrificial metal layer, the second sacrificial metal layer, the first carbon layer, and the second carbon layer includes a strip process using sulfuric acid ($H_2SO_4$).

17. The method of claim 11, wherein
each of the plurality of first layers, the plural amount of first layers, and the plural number of first layers comprises a silicon oxide layer, and
each of the plurality of second layers, the plural amount of second layers, and the plural number of second layers comprises a silicon nitride layer.

18. The method of claim 11, further comprising:
removing the plurality of second layers, the plural amount of second layers, and the plural number of second layers to provide a removed space, and
filling the removed space with word lines.

19. The method of claim 11, further comprising:
forming a channel hole in each of the first vertical hole, the second vertical hole, and the third vertical hole.

20. A method of manufacturing a semiconductor device, the method comprising
performing a process cycle on a substrate,
the process cycle including forming a layer stack on a substrate, forming a plurality of openings extending a depth from an uppermost surface of the layer stack to a lowermost surface of the layer stack, depositing a carbon layer on internal sidewalls of the layer stack in the plurality of openings, and filling the plurality of openings with a sacrificial metal layer,
the layer stack including a plurality of silicon oxide layers and a plurality of silicon nitride layers alternately stacked on each other,
the carbon layer having a thickness in a range of about 5 nm to about 15 nm,
the depositing the carbon layer including selectively depositing the carbon layer on exposed sidewalls of the plurality of silicon nitride layers of the layer stack and not depositing the carbon layer on exposed sidewalls of the plurality of silicon oxide layers of the layer stack;
preparing a plurality of features on the sacrificial metal layer by completing the process cycle one time;
forming a first feature by forming a silicon dioxide stack on some features among the plurality of features, and by forming a first opening with a depth extending from an uppermost surface of the silicon dioxide stack to a lowermost surface of the silicon dioxide stack, the first opening in fluid communication with a corresponding one of the plurality of openings of the layer stack, the forming the first feature including forming a first carbon film in the first opening and forming a first sacrificial metal film in the first opening;
forming a second feature by forming a new layer stack on other features among the plurality of features,
the second feature including a plural amount of silicon oxide layers and a plural amount of silicon nitride layers alternately stacked on each other on the other features among the plurality of features,
the forming the second feature including forming a second opening with a depth extending from an uppermost surface of the new layer stack to a lowermost surface of the new layer stack, the second opening in fluid communication with an underlying one of the plurality of openings, and the forming the second feature including forming a second carbon film in the second opening and forming a second sacrificial metal film in the second opening; and performing a strip process of simultaneously removing the sacrificial metal layer, the carbon layer, the first carbon film, the second carbon film, the first sacrificial metal film, and the second sacrificial metal film.

* * * * *